United States Patent
Fang et al.

(10) Patent No.: US 11,823,983 B2
(45) Date of Patent: Nov. 21, 2023

(54) PACKAGE WITH A SUBSTRATE COMPRISING PAD-ON-PAD INTERCONNECTS

(71) Applicant: QUALCOMM Incorporated, San Diego, CA (US)

(72) Inventors: Kun Fang, San Diego, CA (US); Jaehyun Yeon, San Diego, CA (US); Suhyung Hwang, Rancho Mission Viejo, CA (US); Hong Bok We, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 66 days.

(21) Appl. No.: 17/210,314

(22) Filed: Mar. 23, 2021

(65) Prior Publication Data
US 2022/0310488 A1 Sep. 29, 2022

(51) Int. Cl.
*H01L 23/482* (2006.01)
*H01L 23/522* (2006.01)
*H01L 23/528* (2006.01)

(52) U.S. Cl.
CPC ......... *H01L 23/482* (2013.01); *H01L 23/528* (2013.01); *H01L 23/5226* (2013.01)

(58) Field of Classification Search
CPC .................................................... H01L 23/482
USPC ........................................................ 257/773
See application file for complete search history.

(56) References Cited

U.S. PATENT DOCUMENTS

| 11,545,425 B2 | 1/2023 | Fang et al. | |
|---|---|---|---|
| 2001/0010324 A1* | 8/2001 | Maeda | H05K 3/3457 228/256 |
| 2004/0197541 A1* | 10/2004 | Zahka | H01L 21/288 428/323 |
| 2006/0244128 A1 | 11/2006 | Hayashi et al. | |
| 2011/0147057 A1 | 6/2011 | Takada et al. | |

(Continued)

FOREIGN PATENT DOCUMENTS

| EP | 2632237 A1 | 8/2013 |
|---|---|---|
| JP | 2011119567 A | 6/2011 |

(Continued)

OTHER PUBLICATIONS

International Search Report and Writen Opinion—PCT/US2022/017730—ISA/EPO—dated Jun. 1, 2022.

*Primary Examiner* — Ajay Arora
(74) *Attorney, Agent, or Firm* — Loza & Loza, LLP

(57) ABSTRACT

A package comprising a substrate and an integrated device coupled to the substrate. The substrate comprises at least one dielectric layer; a plurality of interconnects comprising plurality of pad-on-pad interconnects, wherein the plurality of pad-on-pad interconnects is embedded through a first surface of the substrate. The plurality of pad-on-pad interconnects includes a first pad-on-pad interconnect comprising a first pad and a second pad coupled to the first pad. The package further comprising a solder resist layer located over the first surface of the substrate. The solder resist layer comprises a first solder resist layer portion comprising a first thickness; and a second solder resist layer portion comprising a second thickness that is less than the first thickness. The second solder resist layer portion is located between the at least one dielectric layer and the integrated device.

30 Claims, 17 Drawing Sheets

PROFILE VIEW

(56) References Cited

U.S. PATENT DOCUMENTS

| | | |
|---|---|---|
| 2011/0316170 A1 | 12/2011 | Muramatsu et al. |
| 2012/0073862 A1 | 3/2012 | Muramatsu et al. |
| 2013/0234756 A1* | 9/2013 | Rebeor .................. G06F 30/39 716/136 |
| 2014/0069701 A1 | 3/2014 | Hayashi et al. |
| 2014/0091463 A1* | 4/2014 | Yu ..................... H01L 23/49816 257/738 |
| 2016/0300807 A1* | 10/2016 | Deng ................ H01L 23/49827 |
| 2017/0263545 A1 | 9/2017 | Tsukamoto et al. |
| 2020/0066613 A1 | 2/2020 | Lee et al. |

FOREIGN PATENT DOCUMENTS

| | | |
|---|---|---|
| JP | 2017011215 A | 1/2017 |
| WO | 2016164125 A1 | 10/2016 |

\* cited by examiner

PROFILE VIEW

PROFILE VIEW

PROFILE VIEW

PROFILE VIEW

PROFILE VIEW

PROFILE VIEW

PROFILE VIEW

PACKAGE WITH A SUBSTRATE COMPRISING PAD-ON-PAD INTERCONNECTS

FIELD

Various features relate to packages that include an integrated device, but more specifically to a package that includes an integrated device and a substrate.

BACKGROUND

Packages can include a substrate and an integrated device. The substrate may include a plurality of interconnects. The integrated device may be coupled to interconnects of the substrate. There is an ongoing need to provide smaller packages with finer interconnects between the substrate and the integrated device.

SUMMARY

Various features relate to packages that include an integrated device, but more specifically to a package that includes an integrated device and a substrate.

One example provides a package comprising a substrate and an integrated device coupled to the substrate. The substrate comprises at least one dielectric layer; and a plurality of interconnects comprising a plurality of pad-on-pad interconnects, wherein the plurality of pad-on-pad interconnects is embedded through a first surface of the substrate.

Another example provides an apparatus comprising a substrate. The substrate comprises at least one dielectric layer; and a plurality of interconnects comprising a plurality of pad-on-pad interconnects, wherein the plurality of pad-on-pad interconnects is embedded through a first surface of the substrate.

Another example provides a method for fabricating a package. The method provides a substrate comprising at least one dielectric layer; and a plurality of interconnects comprising a plurality of pad-on-pad interconnects, wherein the plurality of pad-on-pad interconnects is embedded through a first surface of the substrate. The method couples an integrated device to the substrate.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a package comprising a substrate and an integrated device coupled to the substrate. The substrate comprises at least one dielectric layer; and a plurality of interconnects comprising a plurality of pad-on-pad interconnects. The plurality of pad-on-pad interconnects is embedded through a first surface (e.g., top surface) of the substrate. The plurality of pad-on-pad interconnects includes a first pad-on-pad interconnect comprising a first pad and a second pad coupled to the first pad. The package further comprises a solder resist layer located over the first surface of the substrate. The solder resist layer comprises a first solder resist layer portion comprising a first thickness; and a second solder resist layer portion comprising a second thickness that is less than the first thickness. The second solder resist layer portion may be located between the at least one dielectric layer and the integrated device.

Exemplary Package Comprising a Substrate Comprising Pad-On-Pad Interconnects

Figure 1:
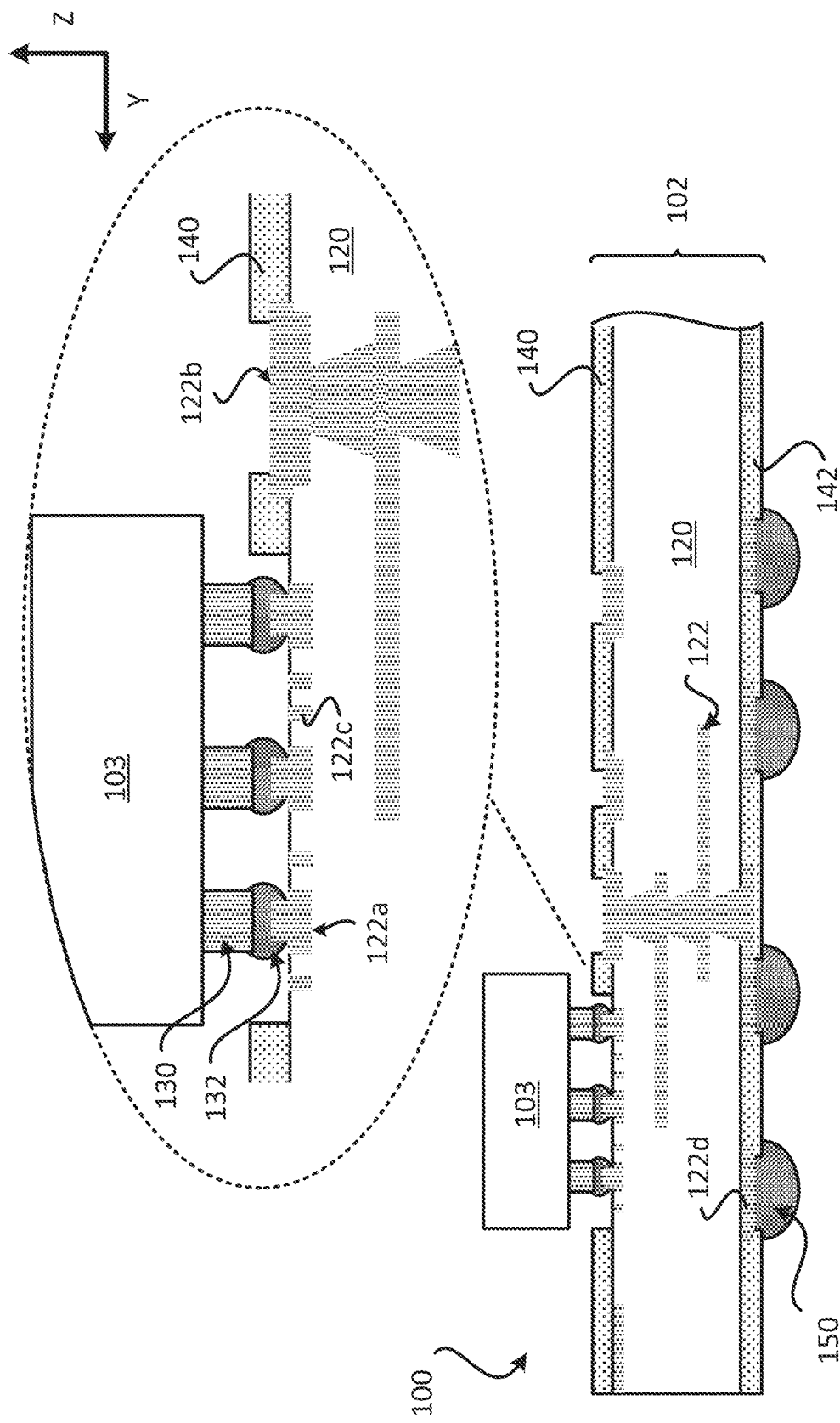
FIG. 1 illustrates a profile view of a package that includes an integrated device and a substrate with pad-on-pad interconnects.

FIG. 1 illustrates a plan view of a package 100 that includes a substrate with pad-on-pad interconnects. The package 100 includes a substrate 102, an integrated device 103. The substrate 102 includes at least one dielectric layer 120, a plurality of interconnects 122, a solder resist layer 140, and a solder resist layer 142. The plurality of interconnects 122 includes a plurality of pad-on-pad interconnects (e.g., 122a, 122b).

As will be further described below, the plurality of pad-on-pad interconnects includes a first pad-on-pad interconnect comprising a first pad and a second pad that is coupled to a first pad. In some implementations, the first pad and the second pad may be considered part of the same pad.

In some implementations, there may or may not be an interface between the first pad and the second pad.

The integrated device 103 is coupled to a first surface (e.g., top surface) of the substrate 102. For example, the integrated device 103 is coupled to the substrate 102 through a plurality of pillar interconnects 130 and a plurality of solder interconnects 132. The integrated device 103 is coupled to a plurality of pad-on-pad interconnects (e.g., 122a) through the plurality of pillar interconnects 130 and the plurality of solder interconnects 132.

As shown in FIG. 1, the solder resist layer 140 is located over the first surface (e.g., top surface) of the substrate 102, and the solder resist layer 142 is located over a second surface (e.g., bottom surface) of the substrate 102. The plurality of interconnects 122 may be located in the at least one dielectric layer 120. The plurality of interconnects 122 includes a plurality of pad-on-pad interconnects (e.g., 122a, 122c), an interconnect 122c and an interconnect 122d. The interconnect 122d may be a surface interconnect. The interconnect 122d may be located over the second surface (e.g., bottom surface) of the substrate 102. For example, the interconnect 122d may be located over the second surface (e.g., bottom surface) of the at least one dielectric layer 120. The interconnect 122c is embedded in the first surface of the substrate 102. The interconnect 122c may include a trace that is embedded in the first surface of the at least one dielectric layer 120. The interconnect 122c may include a trace that is located in the at least one dielectric layer 120 of the substrate 102.

Figure 2:
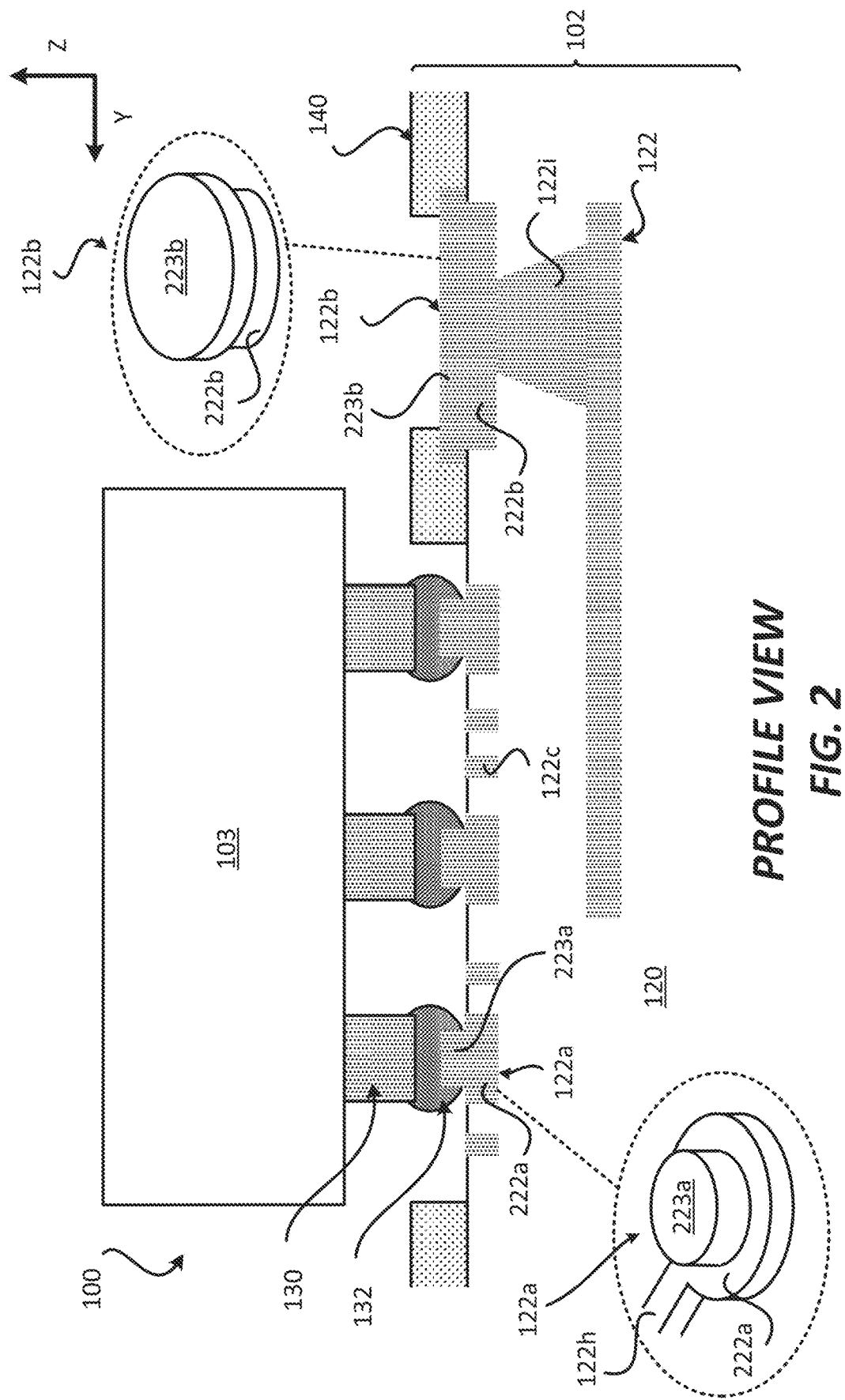
FIG. 2 illustrates a profile close up view of a package that includes an integrated device and a substrate with pad-on-pad interconnects.

FIG. 2 illustrates a close-up profile view of the substrate 102. As shown in FIG. 2, the plurality of pad-on-pad interconnects may include a first pad-on-pad interconnect 122a and a second pad-on-pad interconnect 122b. The first pad-on-pad interconnect 122a is embedded through the first surface (e.g., top surface) of the substrate 102. The first pad-on-pad interconnect 122a includes a first portion 222a and a second portion 223a. The first portion 222a may include a first pad and the second portion 223a may include a second pad. The first pad may be coupled to the second pad. In some implementations, the first portion 222a and the second portion 223a may be part of the same pad (e.g., pad interconnect). In some implementations, there may or may not be an interface between the first portion 222a (e.g., first pad) and the second portion 223a (e.g., second pad). The first portion 222a is located (e.g., embedded) in the at least one dielectric layer 120. The second portion 223a is located over the at least one dielectric layer 120. The first portion 222a may include a first width, and the second portion 223a may include a second width. A width may include a diameter. The first width of the first portion 222a may be different than the second width of the second portion 223a. In FIG. 2, the first width of the first portion 222a is greater than the second width of the second portion 223a. However, the second width may be greater than the first width. In some implementations, the first width may be the same as the second width. The second portion 223a may have a thickness of approximately 15 micrometers or less (e.g., 12-15 micrometers). The first pad-on-pad interconnect 122a is coupled to the interconnect 122h. The interconnect 122h is coupled to the first portion 222a. The interconnect 122h may be a trace that is located in the at least one dielectric layer 120.

As also shown in FIG. 2, the second pad-on-pad interconnect 122b is embedded through the first surface of the substrate 102. The second pad-on-pad interconnect 122b includes a first portion 222b and a second portion 223b. The first portion 222b may include a first pad and the second portion 223b may include a second pad. The first pad may be coupled to the second pad. In some implementations, the first portion 222b and the second portion 223b may be part of the same pad (e.g., pad interconnect). In some implementations, there may or may not be an interface between the first portion 222b (e.g., first pad) and the second portion 223b (e.g., second pad). The first portion 222b is located (e.g., embedded) in the at least one dielectric layer 120. The second portion 223b is located over the at least one dielectric layer 120. The first portion 222b may include a first width, and the second portion 223b may include a second width. A width may include a diameter. The first width may be different than the second width. In some implementations, the first width may be the same as the second width. In FIG. 2, the first width of the first portion 222b is less than the second width of the second portion 223b. However, the second width may be less than the first width. The second portion 223a may have a thickness of approximately 15 micrometers or less (e.g., 12-15 micrometers). The second pad-on-pad interconnect 122b is coupled to the interconnect 122i. The interconnect 122i is coupled to the first portion 222b. The interconnect 122i may be a via that is located in the at least one dielectric layer 120.

The second portions 223a and/or 223b may be protruding portions of an interconnect. That is the second portions 223a and/or 223b may protrude from the at least one dielectric layer 120. The second portions 223a and 223b (e.g., second pad) may include a seed layer. The minimum line width (L) of the pad-on-pad interconnects (e.g., 122a) may be about 10 micrometers. The minimum spacing (S) between the pad-on-pad interconnects may be about 10 micrometers. The minimum spacing (S) between a pad-on-pad interconnect and an interconnect may be about 10 micrometers. In some implementations, the minimum pitch between two neighboring pad-on-pad interconnects (with two traces in between the neighboring pad-on-pad interconnects) configured to couple to pillar interconnects is about 60 micrometers. For example, the minimum pitch between the pad-on-pad interconnects 122f and 122g (as shown in FIG. 3) may be about 60 micrometers.

There are several technical advantages to the configuration shown in at least FIG. 2. One, the pad-on-pad interconnects help decrease the pitch between interconnects for easy signal routing without reducing signal traces, thus more interconnects may be provided in a given region. Two, the protruding portions of the pad-on-pad interconnect (e.g., 122a) may help limit solder interconnect spreading into adjacent traces, thus reducing the risk of shorting. As will be further described below, the use of a solder resist layer with thinned sections may further reduce the likelihood of shorting due to solder interconnect spreading. Similar technical advantages are also found in the other substrates described in the disclosure.

Figure 3:
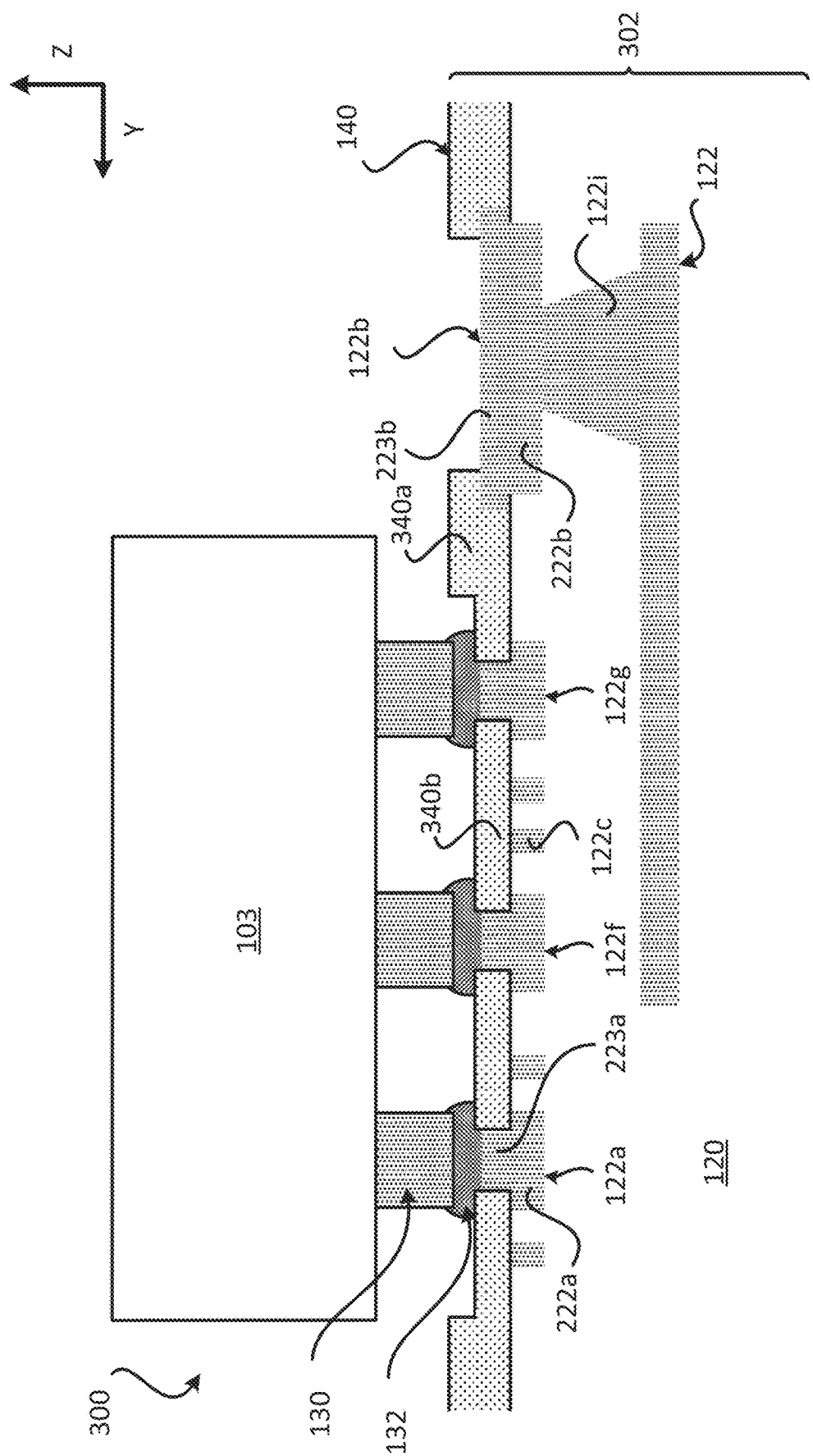
FIG. 3 illustrates a profile close up view of a package that includes an integrated device and a substrate with pad-on-pad interconnects.

FIG. 3 illustrates a substrate 302. The substrate 302 is similar to the substrate 102 of FIGS. 1 and 2, thus includes similar components as the substrate 102. As shown in FIG. 3, the substrate 302 includes the solder resist layer 140 located over the first surface of the substrate 302 (e.g., located over a first surface of the at least one dielectric layer 120). The solder resist layer 140 may include a first solder resist layer portion 340a and a second solder resist layer portion 340b. The first solder resist layer portion 340a has a first thickness, and the second solder resist layer portion 340b has a second thickness that is less than the first thickness. The second solder resist layer portion 340b may have a second thickness that is greater than the thickness of the second portion (e.g., 223a) of the pad-on-pad interconnects (e.g., 122a, 122b). The second solder resist layer portion 340b may be located between the at least one dielectric layer 120 and the integrated device 103. The second solder resist layer portion 340b may be located over the interconnects 122c and the first portion 222a of the pad-on-pad interconnect 122a.

As shown in FIG. 3, the package 300 includes the integrated device 103 and the substrate 302. The integrated device 103 is coupled to a first surface (e.g., top surface) of the substrate 302. For example, the integrated device 103 is coupled to the substrate 302 through a plurality of pillar interconnects 130 and a plurality of solder interconnects 132. The integrated device 103 is coupled to a plurality of pad-on-pad interconnects (e.g., 122a) through the plurality of pillar interconnects 130 and the plurality of solder interconnects 132.

Figure 4:
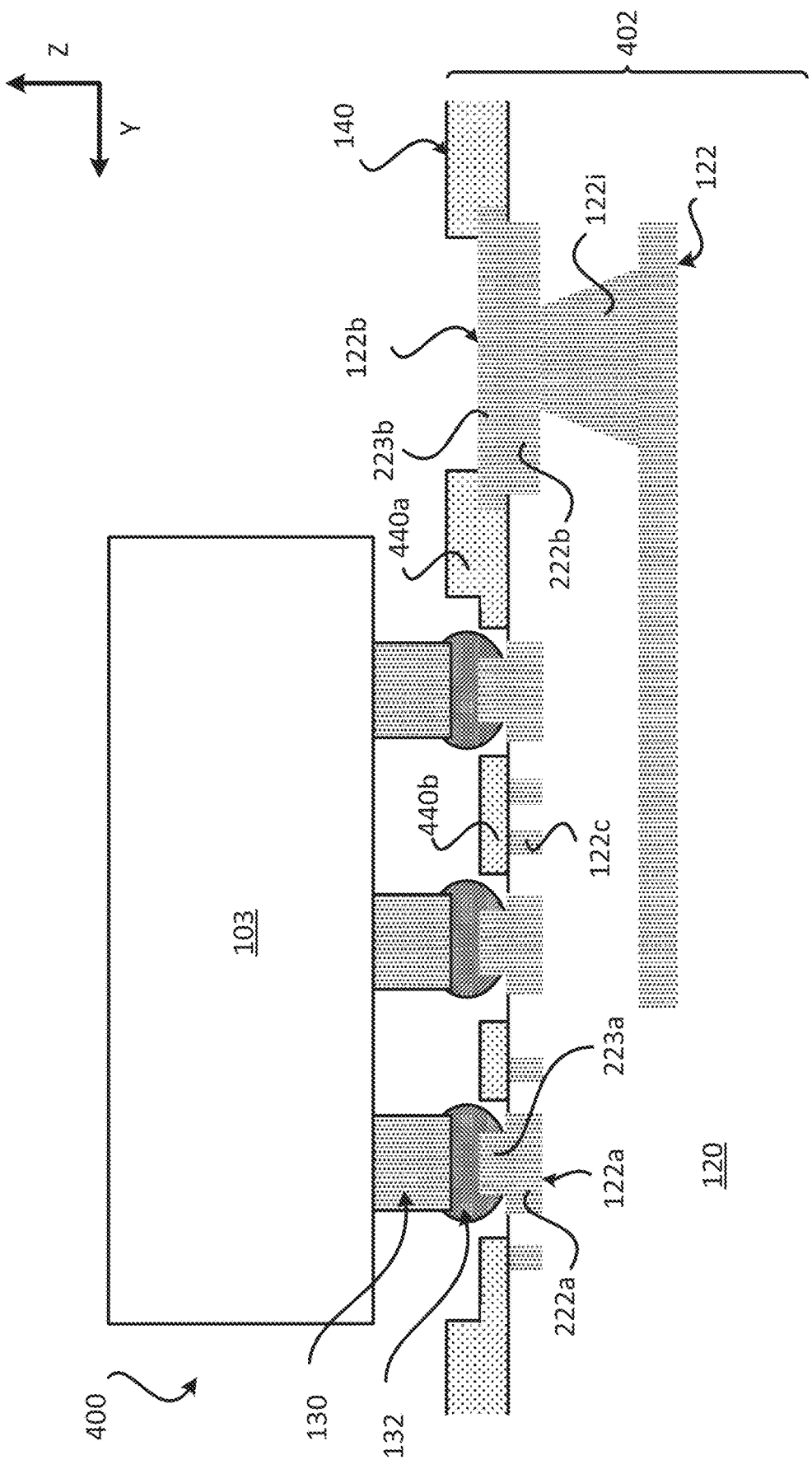
FIG. 4 illustrates a profile close up view of a package that includes an integrated device and a substrate with pad-on-pad interconnects.

FIG. 4 illustrates a substrate 402. The substrate 402 is similar to the substrate 102 of FIGS. 1-2 and the substrate 302, thus includes similar components as the substrate 102 and 302. As shown in FIG. 4, the substrate 402 includes the solder resist layer 140 located over the first surface of the substrate 402 (e.g., located over a first surface of the at least one dielectric layer 120). The solder resist layer 140 may include a first solder resist layer portion 440a and a second solder resist layer portion 440b. The first solder resist layer portion 440a has a first thickness, and the second solder resist layer portion 440b has a second thickness that is less than the first thickness. The second solder resist layer portion 440b may have a second thickness that is about the same as the thickness of the second portion (e.g., 223a) of the pad-on-pad interconnects (e.g., 122a, 122b). The second solder resist layer portion 440b may be located between the at least one dielectric layer 120 and the integrated device 103. The second solder resist layer portion 440b may be located over the interconnects 122c.

As shown in FIG. 4, the package 400 includes the integrated device 103 and the substrate 402. The integrated device 103 is coupled to a first surface (e.g., top surface) of the substrate 402. For example, the integrated device 103 is coupled to the substrate 402 through a plurality of pillar interconnects 130 and a plurality of solder interconnects 132. The integrated device 103 is coupled to a plurality of pad-on-pad interconnects (e.g., 122a) through the plurality of pillar interconnects 130 and the plurality of solder interconnects 132.

Figure 5:
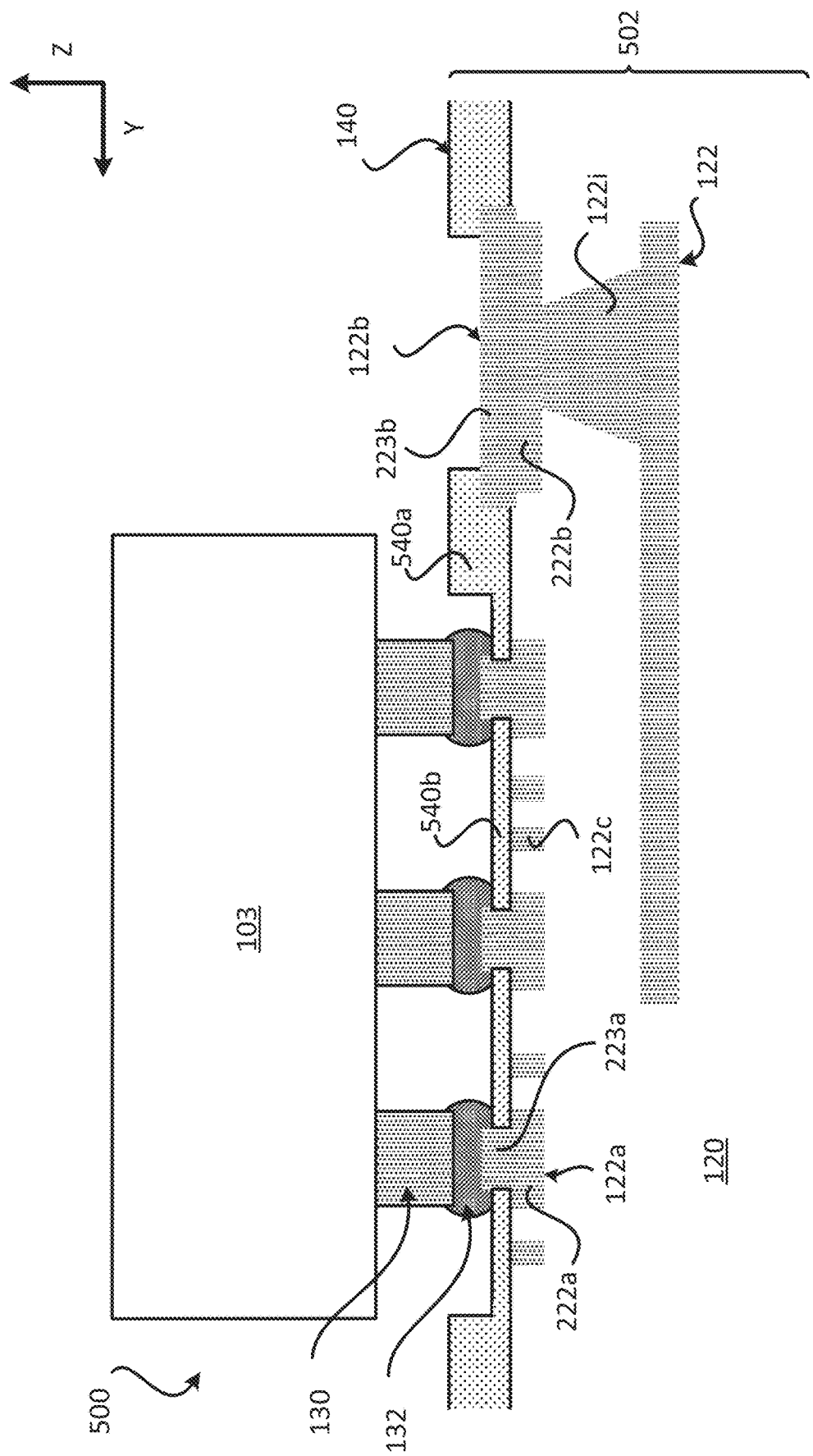
FIG. 5 illustrates a profile close up view of a package that includes an integrated device and a substrate with pad-on-pad interconnects.

FIG. 5 illustrates a substrate 502. The substrate 502 is similar to the substrate 102 of FIGS. 1-2 and the substrate 302, and thus includes similar components as the substrate 102 and 302. As shown in FIG. 5, the substrate 502 includes the solder resist layer 140 located over the first surface of the substrate 502 (e.g., located over a first surface of the at least one dielectric layer 120). The solder resist layer 140 may include a first solder resist layer portion 540a and a second solder resist layer portion 540b. The first solder resist layer portion 540a has a first thickness, and the second solder resist layer portion 540b has a second thickness that is less than the first thickness. The second solder resist layer portion 540b may have a second thickness that is less than the thickness of the second portion (e.g., 223a) of the pad-on-pad interconnects (e.g., 122a, 122b). The second solder resist layer portion 540b may be located between the at least one dielectric layer 120 and the integrated device 103. The second solder resist layer portion 540b may be located over the interconnects 122c and the first portion 222a of the pad-on-pad interconnect 122a.

The thinner solder resist layer portions may be achieved by using a sand blasting process on certain solder resist layer portions. FIGS. 1-5 illustrate pad-on-pad interconnects with inverted T-shaped vertical cross section. In some implementations, pad-on-pad interconnects may have a T-shaped vertical cross section. FIGS. 6-9 illustrate a substrate that includes pad-on-pad interconnects with T-shape cross sections.

As shown in FIG. 5, the package 500 includes the integrated device 103 and the substrate 502. The integrated device 103 is coupled to a first surface (e.g., top surface) of the substrate 502. For example, the integrated device 103 is coupled to the substrate 502 through a plurality of pillar interconnects 130 and a plurality of solder interconnects 132. The integrated device 103 is coupled to a plurality of pad-on-pad interconnects (e.g., 122a) through the plurality of pillar interconnects 130 and the plurality of solder interconnects 132.

Figure 6:
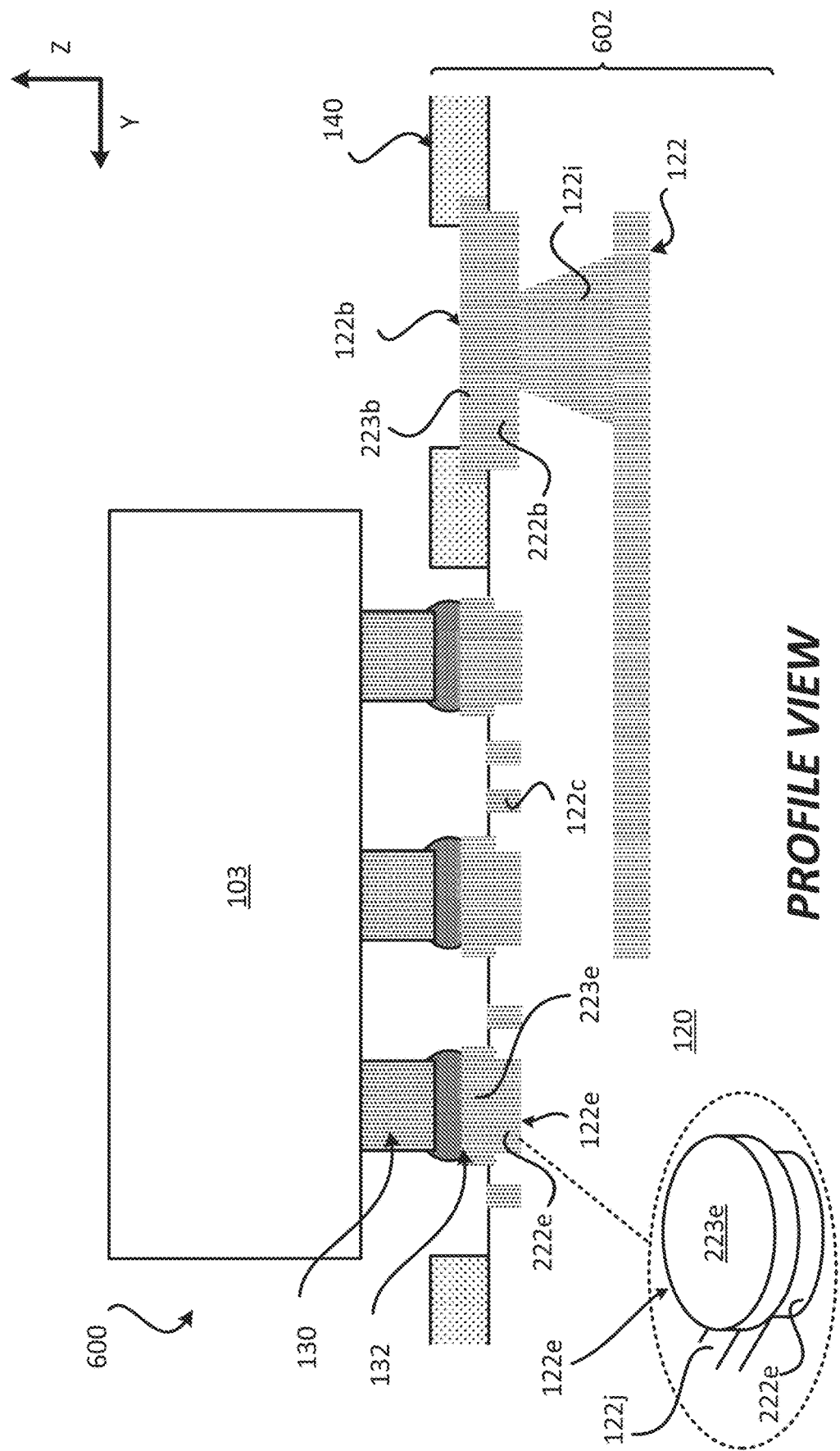
FIG. 6 illustrates a profile close up view of a package that includes an integrated device and a substrate with pad-on-pad interconnects.

FIG. 6 illustrates a substrate 602. The substrate 602 is similar to the substrate 102 of FIGS. 1 and 2, thus includes similar components as the substrate 102. As shown in FIG. 6, the substrate 602 includes the plurality of pad-on-pad interconnects 122b and 122e. The pad-on-pad interconnect 122e is similar to the pad-on-pad interconnect described in FIGS. 1-2.

The pad-on-pad interconnect 122e is embedded through the first surface of the substrate 102. The pad-on-pad interconnect 122e includes a first portion 222e and a second portion 223e. The first portion 222e may include a first pad and the second portion 223e may include a second pad. The first pad may be coupled to the second pad. In some implementations, the first portion 222e (e.g., first pad) and the second portion 223e (e.g., second pad) may be part of the same pad (e.g., pad interconnect). In some implementations, there may or may not be an interface between the first portion 222e and the second portion 223e. The first portion 222e is located (e.g., embedded) in the at least one dielectric layer 120. The second portion 223e is located over the at least one dielectric layer 120. The first portion 222e may include a first width, and the second portion 223a may include a second width. A width may include a diameter. The first width may be different than the second width. In FIG. 6, the first width of the first portion 222e is less than the second width of the second portion 223e. However, the second width may be less than the first width. The second portion 223e may have a thickness of approximately 15 micrometers or less (e.g., 12-15 micrometers). The first pad-on-pad interconnect 122e is coupled to the interconnect 122j. The interconnect 122j is coupled to the first portion 222e. The interconnect 122j may be a trace that is located in the at least one dielectric layer 120.

The solder resist layer 140 located over the first surface of the substrate 302 (e.g., located over a first surface of the at least one dielectric layer 120). The solder resist layer 140 may include a first solder resist layer portion 340a and a second solder resist layer portion 340b. The first solder resist layer portion 340a has a first thickness, and the second solder resist layer portion 340b has a second thickness that is less than the first thickness. The second solder resist layer portion 340b may have a second thickness that is greater than the thickness of the second portion (e.g., 223a) of the pad-on-pad interconnects (e.g., 122a, 122b). The second solder resist layer portion 340b may be located between the at least one dielectric layer 120 and the integrated device 103. The second solder resist layer portion 340b may be located over the interconnects 122c and the first portion 222a of the pad-on-pad interconnect 122a.

As shown in FIG. 6, the package 600 includes the integrated device 103 and the substrate 602. The integrated device 103 is coupled to a first surface (e.g., top surface) of the substrate 602. For example, the integrated device 103 is coupled to the substrate 602 through a plurality of pillar interconnects 130 and a plurality of solder interconnects 132. The integrated device 103 is coupled to a plurality of pad-on-pad interconnects (e.g., 122e) through the plurality of pillar interconnects 130 and the plurality of solder interconnects 132.

Figure 7:
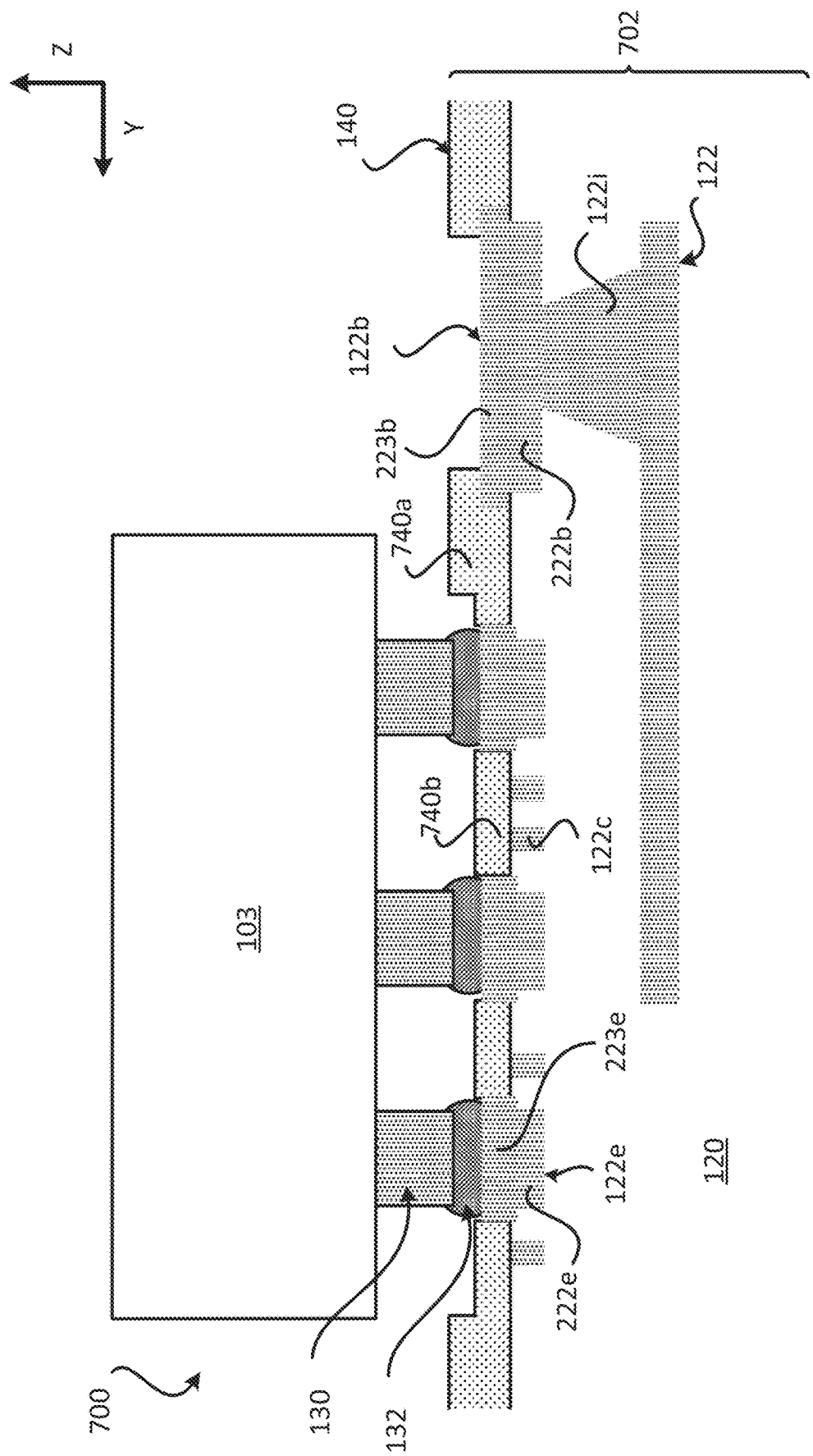
FIG. 7 illustrates a profile view of a package that includes a substrate with pad-on-pad interconnects.

FIG. 7 illustrates a substrate 702. The substrate 702 is similar to the substrate 102 of FIGS. 1 and 2 and the substrate 602, thus includes similar components as the substrate 102 and the substrate 602. As shown in FIG. 7, the substrate 702 includes the solder resist layer 140 located over the first surface of the substrate 702 (e.g., located over a first surface of the at least one dielectric layer 120). The solder resist layer 140 may include a first solder resist layer portion 740a and a second solder resist layer portion 740b. The first solder resist layer portion 740a has a first thickness, and the second solder resist layer portion 740b has a second thickness that is less than the first thickness. The second solder resist layer portion 740b may have a second thickness that is greater than the thickness of the second portion (e.g., 223e) of the pad-on-pad interconnects (e.g., 122e, 122b). The second solder resist layer portion 740b may be located between the at least one dielectric layer 120 and the integrated device 103. The second solder resist layer portion 740b may be located over the interconnects 122c and the first portion 222a of the pad-on-pad interconnect 122a.

As shown in FIG. 7, the package 700 includes the integrated device 103 and the substrate 702. The integrated device 103 is coupled to a first surface (e.g., top surface) of the substrate 702. For example, the integrated device 103 is coupled to the substrate 702 through a plurality of pillar interconnects 130 and a plurality of solder interconnects 132. The integrated device 103 is coupled to a plurality of pad-on-pad interconnects (e.g., 122e) through the plurality of pillar interconnects 130 and the plurality of solder interconnects 132.

Figure 8:
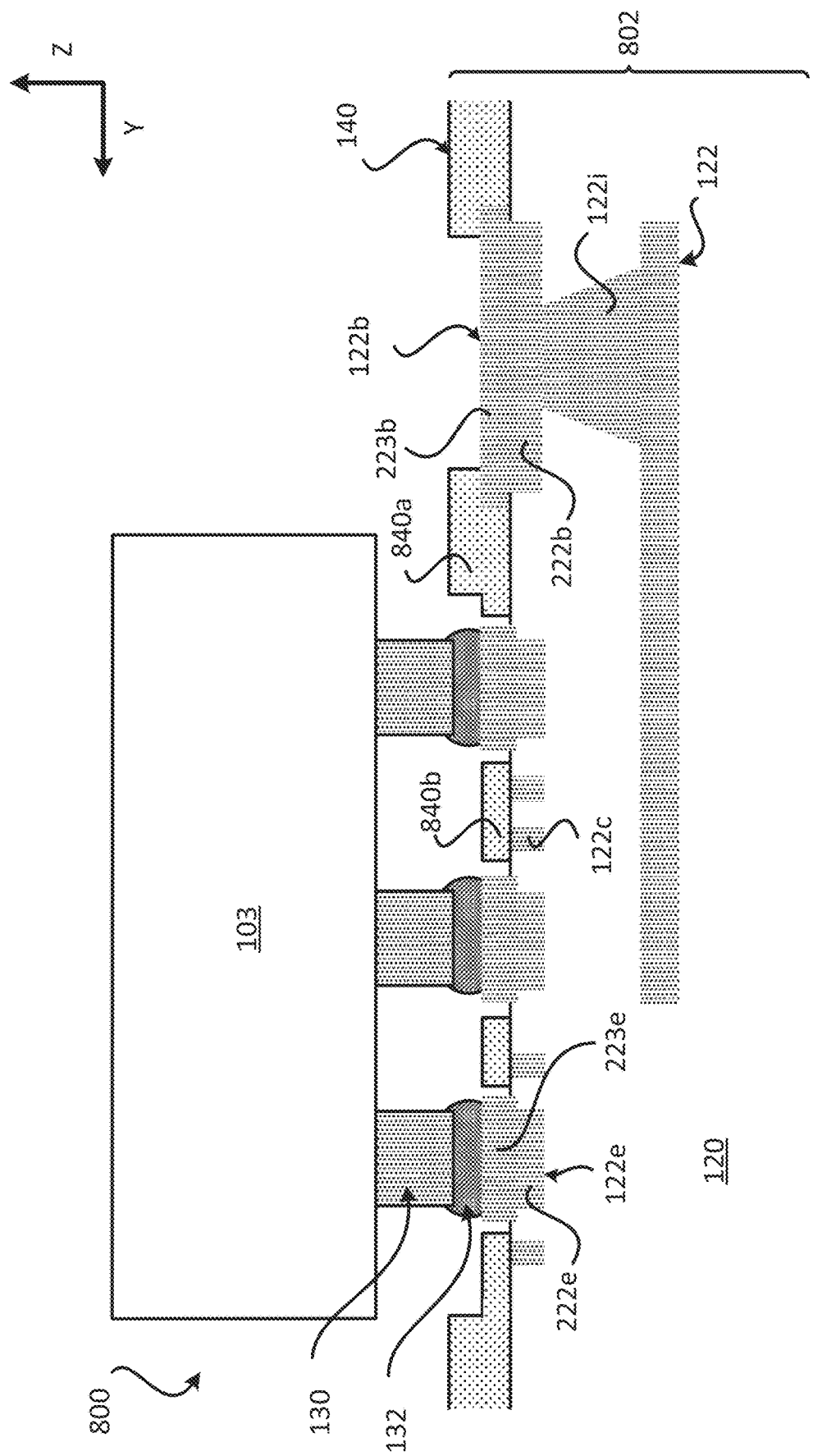
FIG. 8 illustrates a profile view of a package that includes a substrate with pad-on-pad interconnects.

FIG. 8 illustrates a substrate 802. The substrate 802 is similar to the substrate 102 of FIGS. 1-2 and the substrate 602, thus includes similar components as the substrate 102 and 602. As shown in FIG. 8, the substrate 802 includes the solder resist layer 140 located over the first surface of the substrate 802 (e.g., located over a first surface of the at least one dielectric layer 120). The solder resist layer 140 may include a first solder resist layer portion 840a and a second solder resist layer portion 840b. The first solder resist layer portion 840a has a first thickness, and the second solder resist layer portion 840b has a second thickness that is less than the first thickness. The second solder resist layer portion 840b may have a second thickness that is about the same as the thickness of the second portion (e.g., 223e) of the pad-on-pad interconnects (e.g., 122e, 122b). The second solder resist layer portion 840b may be located between the at least one dielectric layer 120 and the integrated device 103. The second solder resist layer portion 840b may be located over the interconnects 122c.

As shown in FIG. 8, the package 800 includes the integrated device 103 and the substrate 802. The integrated device 103 is coupled to a first surface (e.g., top surface) of the substrate 802. For example, the integrated device 103 is coupled to the substrate 802 through a plurality of pillar interconnects 130 and a plurality of solder interconnects 132. The integrated device 103 is coupled to a plurality of pad-on-pad interconnects (e.g., 122e) through the plurality of pillar interconnects 130 and the plurality of solder interconnects 132.

Figure 9:
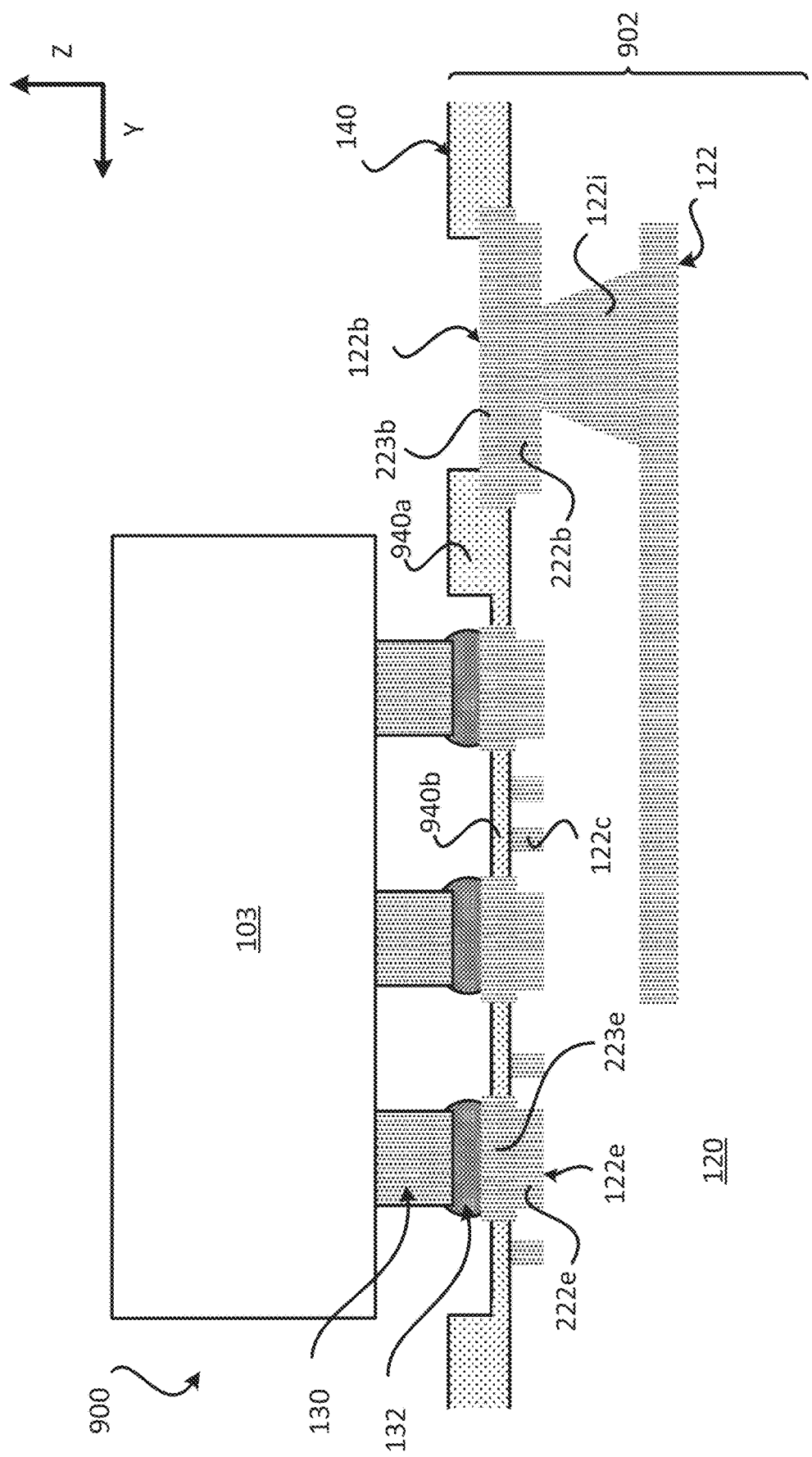
FIG. 9 illustrates a profile view of a package that includes a substrate with pad-on-pad interconnects.

FIG. 9 illustrates a substrate 902. The substrate 902 is similar to the substrate 102 of FIGS. 1-2 and the substrate 602, thus includes similar components as the substrate 102 and 602. As shown in FIG. 9, the substrate 902 includes the solder resist layer 140 located over the first surface of the substrate 902 (e.g., located over a first surface of the at least one dielectric layer 120). The solder resist layer 140 may include a first solder resist layer portion 940a and a second solder resist layer portion 940b. The first solder resist layer portion 940a has a first thickness, and the second solder resist layer portion 940b has a second thickness that is less than the first thickness. The second solder resist layer portion 940b may have a second thickness that is less than the thickness of the second portion (e.g., 223e) of the pad-on-pad interconnects (e.g., 122e, 122b). The second solder resist layer portion 940b may be located between the at least one dielectric layer 120 and the integrated device 103. The second solder resist layer portion 940b may be located over the interconnects 122c and the first portion 222a of the pad-on-pad interconnect 122a.

The thinner solder resist layer portions may be achieved by using a sand blasting process on certain solder resist layer portions.

As shown in FIG. 9, the package 900 includes the integrated device 103 and the substrate 902. The integrated device 103 is coupled to a first surface (e.g., top surface) of the substrate 902. For example, the integrated device 103 is coupled to the substrate 902 through a plurality of pillar interconnects 130 and a plurality of solder interconnects 132. The integrated device 103 is coupled to a plurality of pad-on-pad interconnects (e.g., 122e) through the plurality of pillar interconnects 130 and the plurality of solder interconnects 132.

The integrated device (e.g., 103) may include a die (e.g., semiconductor bare die). The integrated device may include a power management integrated circuit (PMIC). The integrated device may include an application processor. The integrated device may include a radio frequency (RF) device, a passive device, a filter, a capacitor, an inductor, an antenna, a transmitter, a receiver, a gallium arsenide (GaAs) based integrated device, a surface acoustic wave (SAW) filters, a bulk acoustic wave (BAW) filter, a light emitting diode (LED) integrated device, a silicon (Si) based integrated device, a silicon carbide (SiC) based integrated device, a memory, power management processor, and/or combinations thereof. An integrated device (e.g., 103) may include at least one electronic circuit (e.g., first electronic circuit, second electronic circuit, etc. . . . ).

The plurality of pad-on-pad interconnects (e.g., 122a, 122e) may have a first minimum pitch and a first minimum line width (L) and spacing (S) (e.g., L/S). In some implementations, the first minimum line and spacing (L/S) for the plurality of pad-on-pad interconnects is approximately 10/10 micrometers (μm) (e.g., minimum line width of approximately 10 micrometers (μm), minimum spacing of approximately 10 micrometers (μm)).

Different implementations may use different substrates. The substrates (e.g., 102, 302, 402, 502, 602, 702, 802, 902) may include an embedded trace substrate (ETS). The substrate may have different numbers of metal layers (e.g., 10 metal layers). The at least one dielectric layer 120 may include prepreg. An example of fabricating a substrate is further described below in FIGS. 10A-10D. As will be further described below, in some implementations, the substrate 202 may be fabricated using a modified semi-additive process (mSAP) or a semi-additive process (SAP).

Exemplary Sequence for Fabricating a Substrate Comprising Pad-on-Pad Interconnects In some implementations, fabricating a substrate includes several processes. FIGS. 10A-10D illustrate an exemplary sequence for providing or fabricating a substrate. In some implementations, the sequence of FIGS. 10A-10D may be used to provide or fabricate the substrate 302 of FIG. 3. However, the process of FIGS. 10A-10D may be used to fabricate any of the substrates (e.g., 102, 402, 502, 602, 702, 802, 902) described in the disclosure.

It should be noted that the sequence of FIGS. 10A-10D may combine one or more stages in order to simplify and/or clarify the sequence for providing or fabricating a substrate. In some implementations, the order of the processes may be changed or modified. In some implementations, one or more of processes may be replaced or substituted without departing from the scope of the disclosure.

Figure 10A:
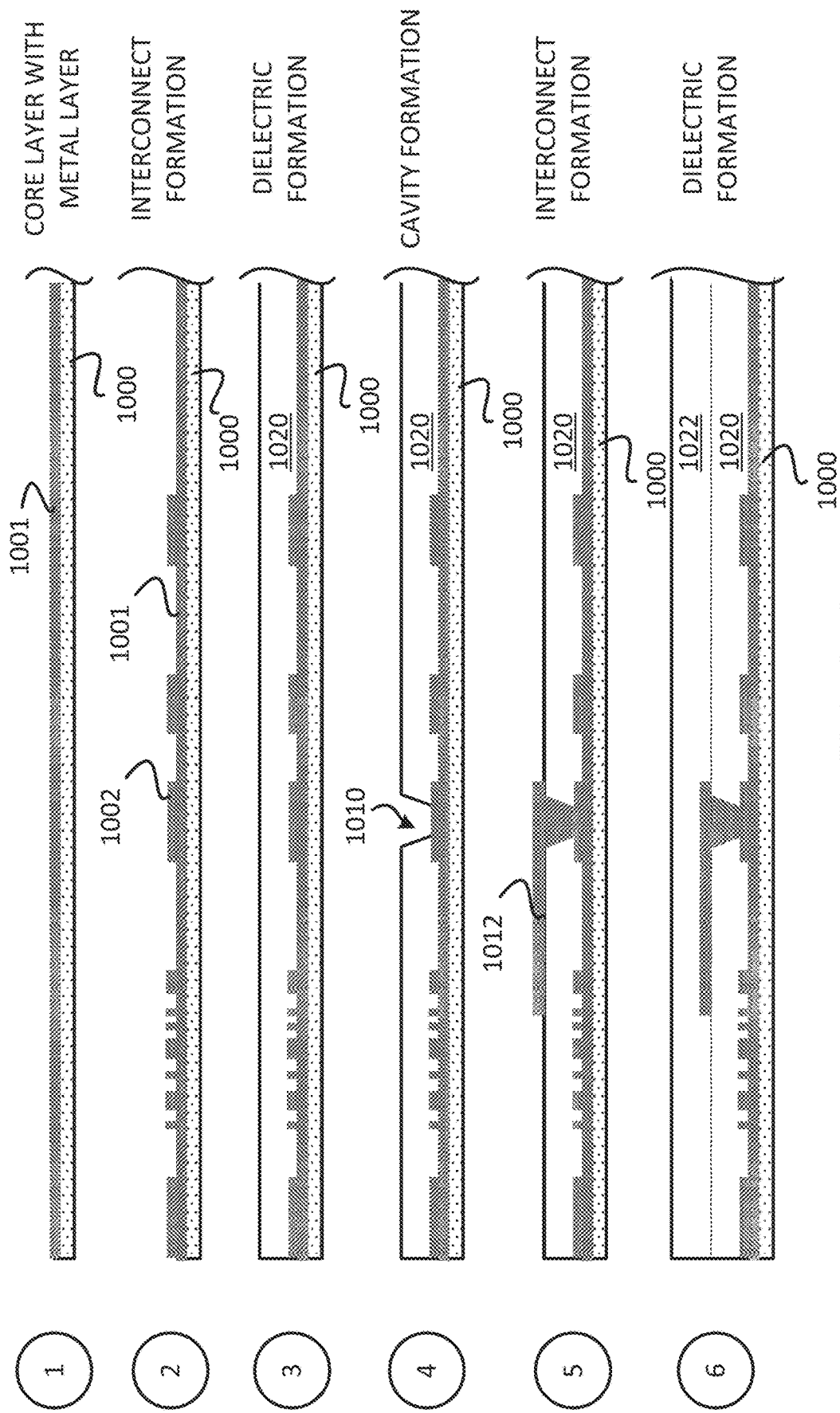
FIGS. 10A-10D illustrate an exemplary sequence for fabricating a substrate.

Stage 1, as shown in FIG. 10A, illustrates a state after a core layer 1000 is provided. The core layer 1000 includes a metal layer 1001. The metal layer 1001 may include a seed layer (e.g., copper seed layer). Another metal layer may be located on the other side of the core layer. It is noted that the following process will be described through a fabrication process that forms interconnects and dielectric layers on one side of the core layer. However, in some implementations, the interconnects and dielectric layers may be formed on both sides of the core layer 1000. The core layer 1000 is an example of a carrier that is used as a base. In some implementations, other carriers may be used, such as glass or quartz.

Stage 2 illustrates a state after interconnects 1002 are formed over the core layer 1000 and the metal layer 1001. The interconnects 1002 may be patterned from a metal layer. A plating process and etching process may be used to form the metal layer and interconnects.

Stage 3 illustrates a state after a dielectric layer 1020 is formed over the core layer 1000 and the interconnects 1002. The dielectric layer 1020 may include polyimide. However, different implementations may use different materials for the dielectric layer.

Stage 4 illustrates a state after a plurality of cavities 1010 is formed in the dielectric layer 1020. The plurality of cavities 1010 may be formed using an etching process (e.g., photo etching process) or laser process.

Stage 5 illustrates a state after interconnects 1012 are formed in and over the dielectric layer 1020. For example, a via, pad and/or traces may be formed. A plating process may be used to form the interconnects.

Stage 6 illustrates a state after another dielectric layer 1022 is formed over the dielectric layer 1020. The dielectric layer 1022 may be the same material as the dielectric layer 1020. However, different implementations may use different materials for the dielectric layer.

Figure 10B:
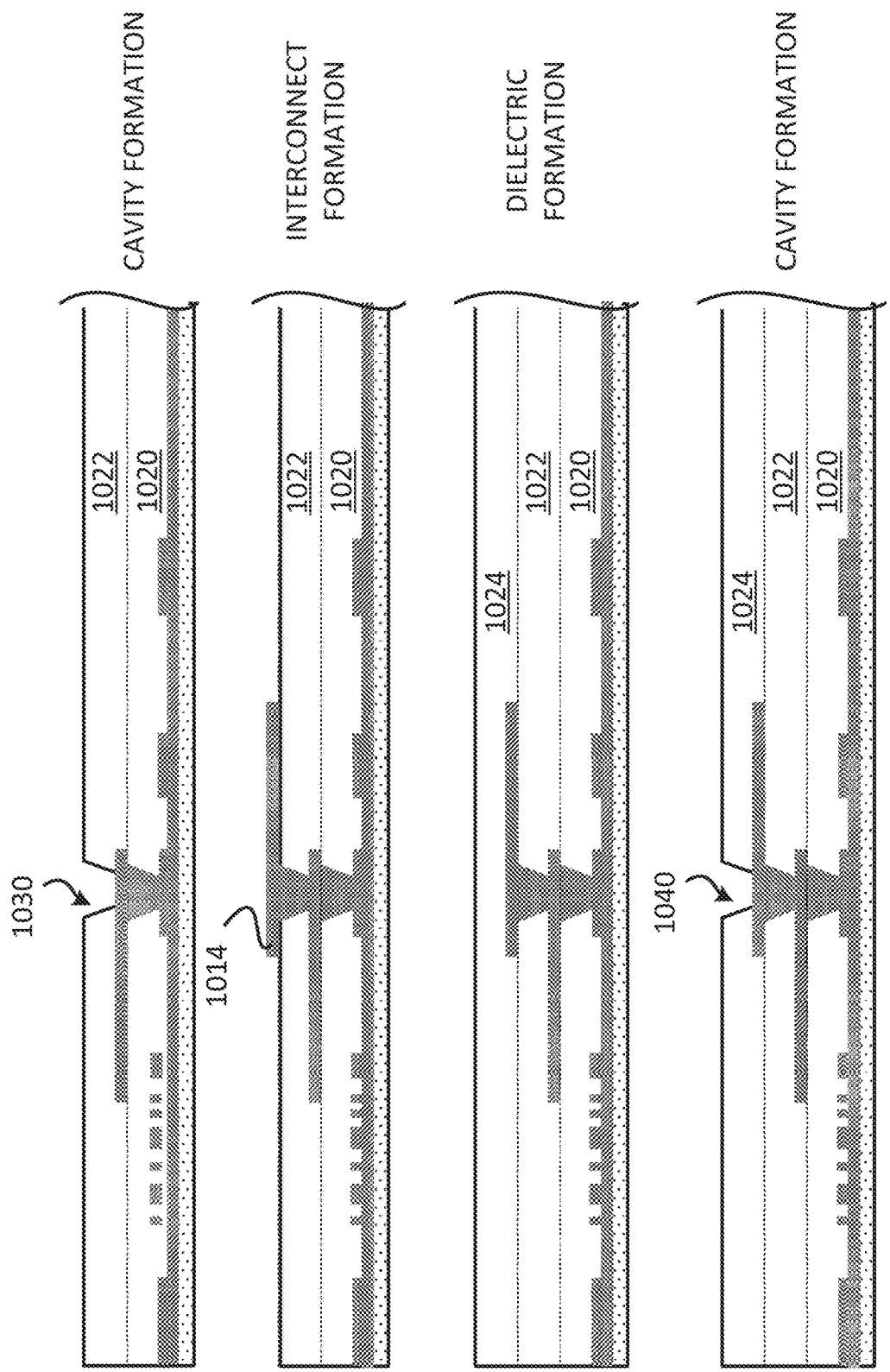

Stage 7, as shown in FIG. 10B, illustrates a state after a plurality of cavities 1030 is formed in the dielectric layer 1022. An etching process or laser process may be used to form the cavities 1030.

Stage 8 illustrates a state after interconnects 1014 are formed in and over the dielectric layer 1022. For example, via, pad and/or trace may be formed. A plating process may be used to form the interconnects.

Stage 9 illustrates a state after another dielectric layer 1024 is formed over the dielectric layer 1022. The dielectric layer 1024 may be the same material as the dielectric layer 1020. However, different implementations may use different materials for the dielectric layer.

Stage 10 illustrates a state after a plurality of cavities 1040 is formed in the dielectric layer 1024. An etching process or laser process may be used to form the cavities 1040.

Figure 10C:
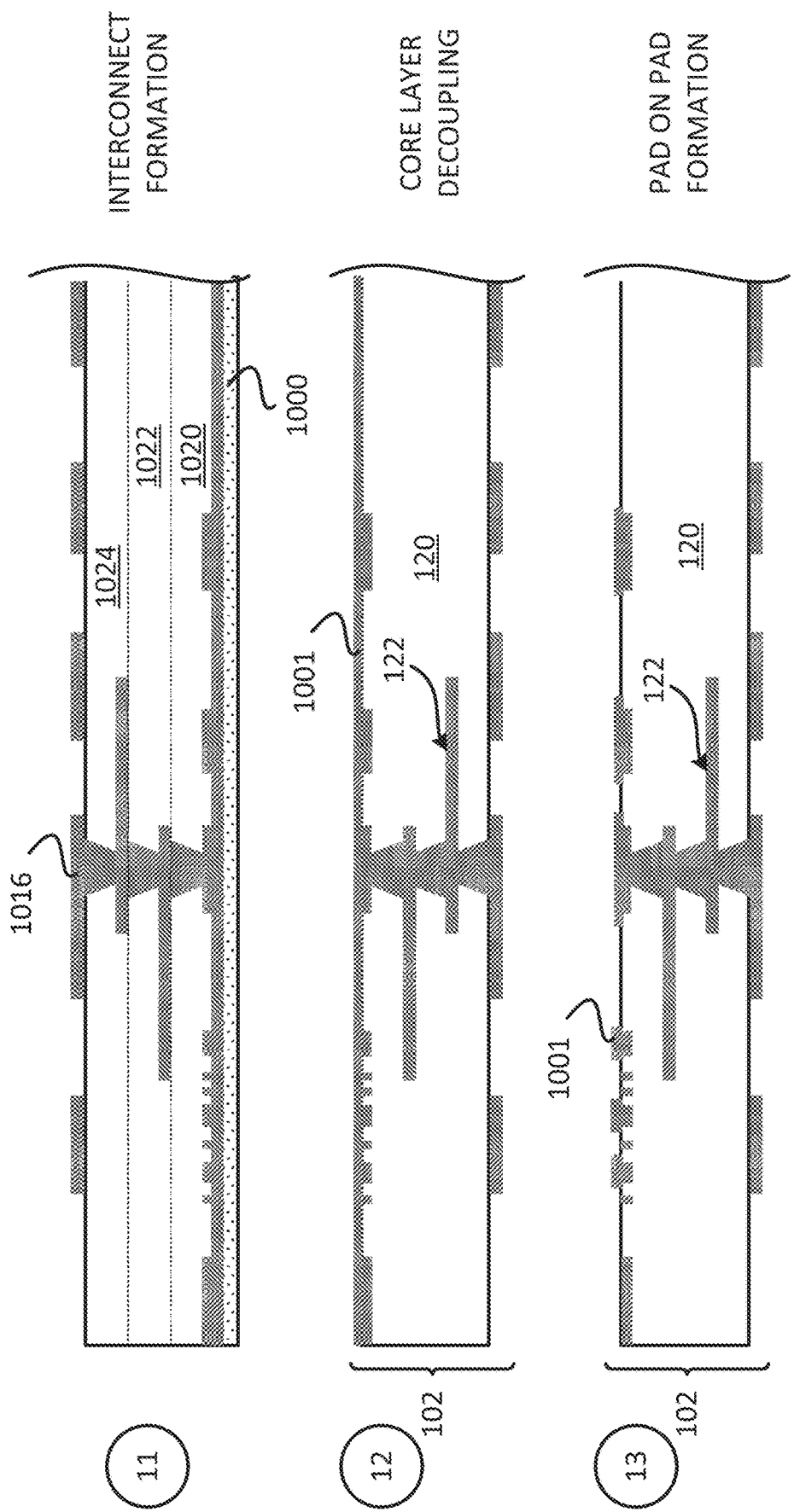

Stage 11, as shown in FIG. 10C, illustrates a state after interconnects 1016 are formed in and over the dielectric layer 1024. For example, via, pad and/or trace may be formed. A plating process may be used to form the interconnects.

Some or all of the interconnects 1002, 1012, 1014 and/or 1016 may define the plurality of interconnects 122 of the substrate 102. The dielectric layers 1020, 1022, 1024 may be represented by the at least one dielectric layer 120.

Stage 12 illustrates a state after the core layer 1000 is decoupled (e.g., removed, grinded out) from the dielectric layer 120, leaving the substrate 102 with the metal layer 1001. The metal layer 1001 may include a seed layer.

Stage 13 illustrates a state after the metal layer 1001 has been patterned to form pads on pads. For example, the metal layer 1001 may be patterned to form the portion 223a and the portion 223b, as described in FIG. 3. The portion 223a and the portion 223b may be protruding from the at least one dielectric layer 120. An etching process may be used to form the portion 223a and the portion 223b. The portion 223a and the portion 223b may be part of the plurality of pad-on-pad interconnects.

Figure 10D:
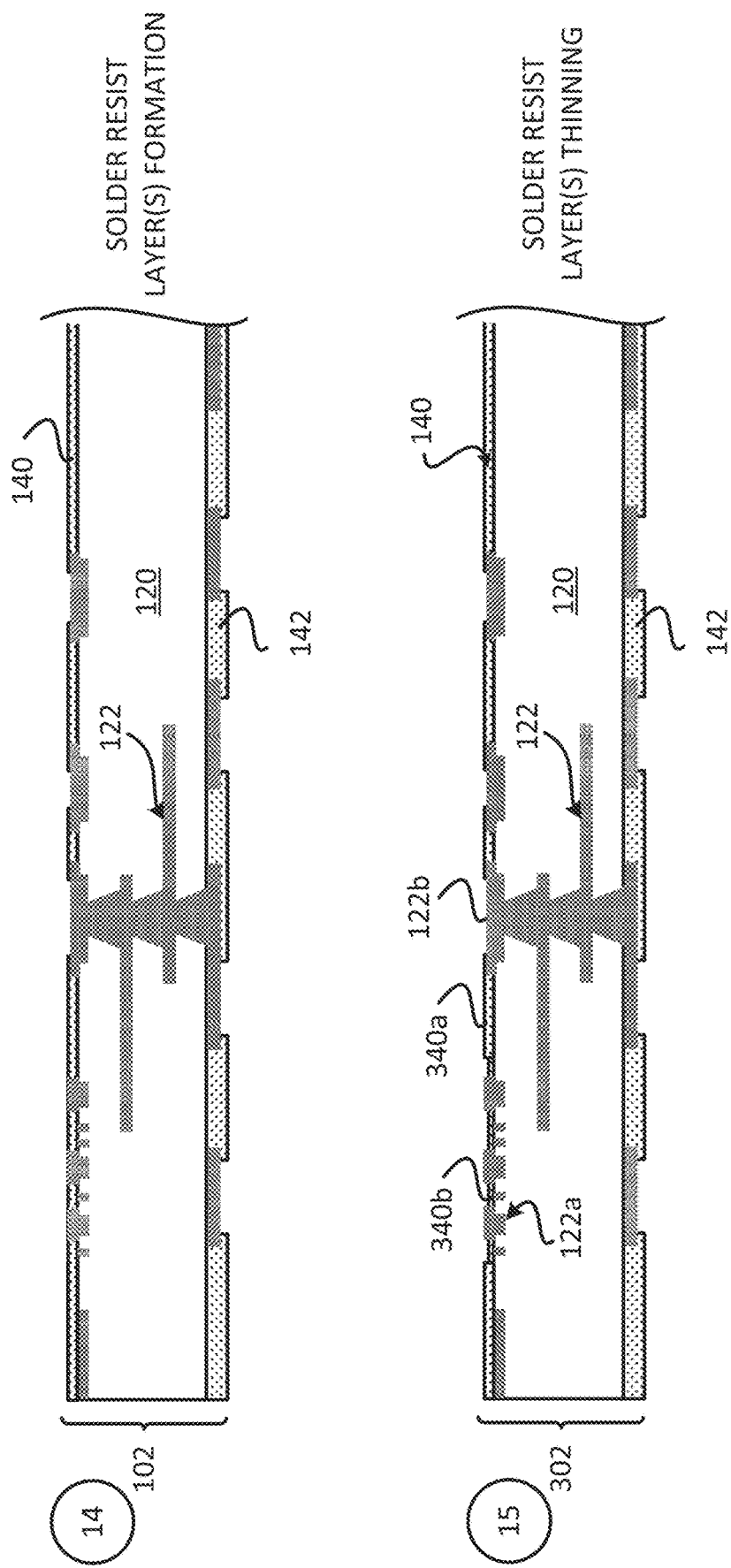

Stage 14, as shown in FIG. 10D, illustrates a state after the solder resist layer 140 and the solder resist layer 142 are formed over the substrate 102. The solder resist layer 140 is formed over a first surface of the dielectric layer 120 (e.g., first surface of the substrate). The solder resist layer 142 is formed over a second surface of the dielectric layer 120 (e.g., second surface of the substrate). A deposition process(es) may be used to form the solder resist layer 140 and the solder resist layer 142. The solder resist layer 140 and the solder resist layer 142 may be part of the substrate 102.

Stage 15 illustrates a stater after portions of the solder resist layer 140 has been thinned. After thinning, the solder resist layer 140 includes a solder resist layer portion 340a and a solder resist layer portion 340b. The solder resist layer portion 340 has a first thickness and the solder resist layer portion 340b has a second thickness that is different than the first thickness. A sand blasting process may be used to form a thinned solder resist layer portion. For example, portions of the solder resist layer that should be thinned may be exposed to a sand blasting process. Different implementations may have different thicknesses for the solder resist layer portion 340b. Stage 15 illustrates the substrate 302 that includes pad-on-pad interconnects (e.g., 122a, 122b) and a solder resist layer 140 having variable thicknesses.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 11:
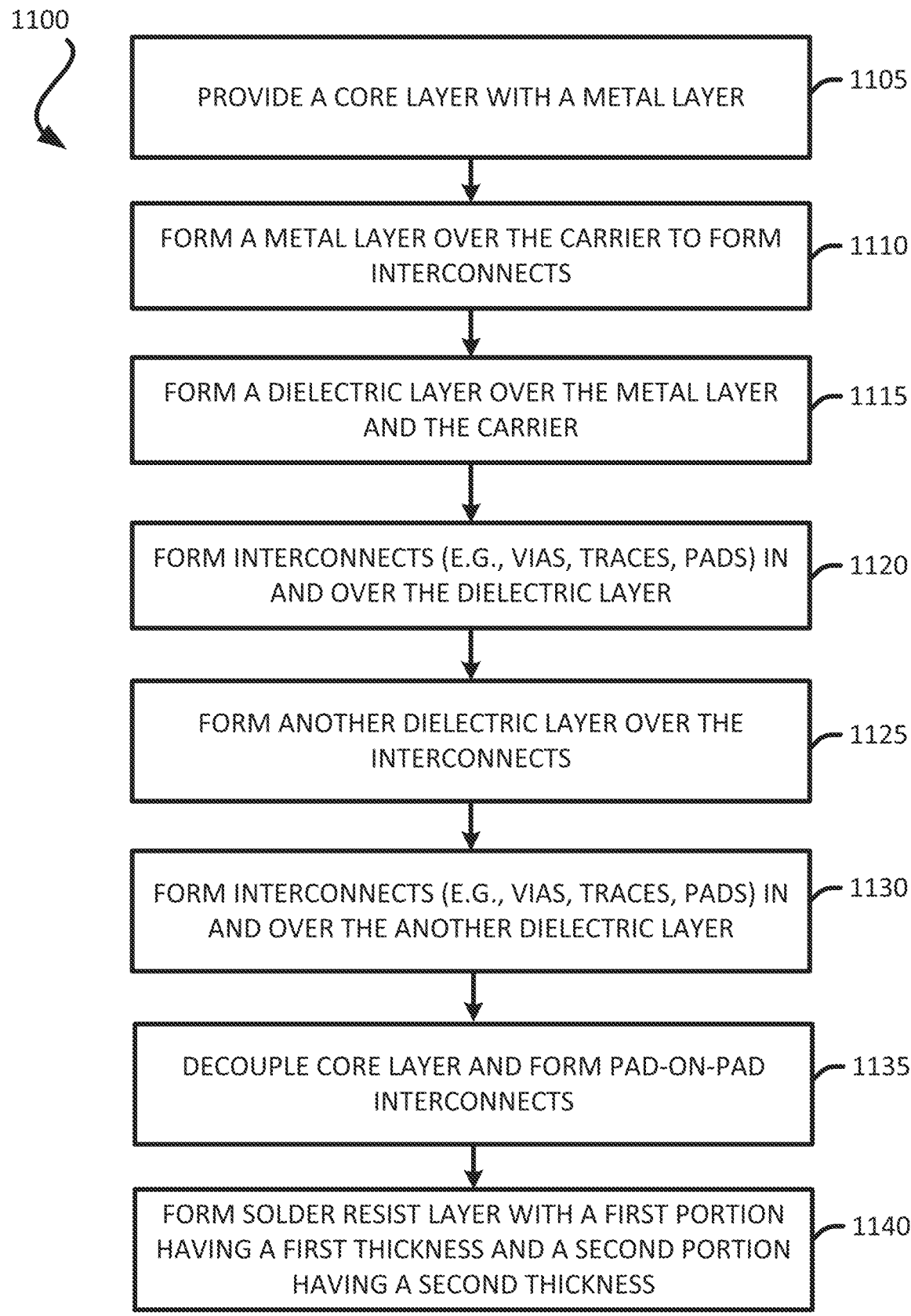
FIG. 11 illustrates an exemplary flow diagram of a method for fabricating a substrate.

Exemplary Flow Diagram of a Method for Fabricating a Substrate Comprising Pad-On-Pad Interconnects In some implementations, fabricating a substrate includes several processes. FIG. 11 illustrates an exemplary flow diagram of a method 1100 for providing or fabricating a substrate. In some implementations, the method 1100 of FIG. 11 may be used to provide or fabricate the substrate of FIG. 1. For example, the method of FIG. 11 may be used to fabricate the substrate 102. The method 1100 of FIG. 11 will be used to describe fabricating the substrate 302.

It should be noted that the method of FIG. 11 may combine one or more processes in order to simplify and/or clarify the method for providing or fabricating a substrate. In some implementations, the order of the processes may be changed or modified.

The method provides (at 1105) a core layer 1000 that includes a metal layer 1001. Different implementations may use different materials for the core layer. It is noted that the core layer is an example of a carrier that may be used. However, other carriers may be used. For example, the carrier may include a substrate, glass, quartz and/or carrier tape. Stage 1 of FIG. 10A illustrates and describes an example of a state after a core layer with a metal layer is provided.

The method forms (at 1110) a metal layer over the core layer 1000 and the metal layer 1001. The metal layer may be patterned to form interconnects 1002. A plating process may be used to form the metal layer and interconnects. Stage 2 of FIG. 10A illustrates and describes an example of a state after a metal layer and interconnects 1002 are formed.

The method forms (at 1115) a dielectric layer 1020 over the core layer 1000, the metal layer 1001 and the interconnects 1002. The dielectric layer 1020 may include polyimide. Forming the dielectric layer may also include forming a plurality of cavities (e.g., 1010) in the dielectric layer 1020. The plurality of cavities may be formed using an etching process (e.g., photo etching) or laser process. Stages 3-4 of FIG. 10A illustrate and describe an example of forming a dielectric layer and cavities in the dielectric layer.

The method forms (at 1120) interconnects in and over the dielectric layer. For example, the interconnects 1012 may be formed in and over the dielectric layer 1020. A plating process may be used to form the interconnects. Forming interconnects may include providing a patterned metal layer over and/or in the dielectric layer. Stage 5 of FIG. 10A illustrates and describes an example of forming interconnects in and over a dielectric layer.

The method forms (at 1125) a dielectric layer 1022 over the dielectric layer 1020 and the interconnects. The dielectric layer 1022 may include polyimide. Forming the dielectric layer may also include forming a plurality of cavities (e.g., 1030) in the dielectric layer 1022. The plurality of cavities may be formed using an etching process or laser process. Stages 6-7 of FIGS. 10A-10B illustrate forming a dielectric layer and cavities in the dielectric layer.

The method forms (at 1130) interconnects in and/or over the dielectric layer. For example, the interconnects 1014 may be formed. A plating process may be used to form the interconnects. Forming interconnects may include providing a patterned metal layer over an in the dielectric layer. Stage 8 of FIG. 10B illustrates and describes an example of forming interconnects in and over a dielectric layer.

The method may form additional dielectric layer(s) and additional interconnects as described at 1125 and 1130. Stages 9-11 of FIGS. 10B-10C illustrate and describe an example of forming additional interconnects in and over a dielectric layer.

Once all the dielectric layer(s) and additional interconnects are formed, the method may decouple (e.g., remove, grind out) (at 1135) the core layer (e.g., 1000) from the dielectric layer 1020, leaving the substrate with the metal layer 1001. The method may also form (at 1135) pad-on-pad interconnects by patterning the metal layer 1001 into pads. An etching process may be used to pattern the metal layer 1001. Stage 12 of FIG. 10C illustrates and describes an example of a state after the decoupling a core layer. Stage 13 of FIG. 10C illustrates and describes an example of patterning a metal layer to form a pad on a pad.

The method may form (at 1140) solder resist layers (e.g., 140, 142) over the substrate. A deposition process may be used to form the solder resist layer. Stage 14 of FIG. 10D, illustrates and describes an example of a state after forming solder resist layers.

The method may thin (at 1140) portions of the solder resist layer. For example, the solder resist layer 140 may be thinned in select locations so that the solder resist layer 140 includes a first solder resist layer portion 340a and a second solder resist layer portion 340b. The first solder resist layer portion 340a may have a first thickness and the second solder resist layer portion 340b may have a second thickness that is less than the first thickness. How much a solder resist layer is thinned may vary with different implementations. In some implementations, a sand blasting process may be used to thin portions of a solder resist layer. Stage 15 of FIG. 10D illustrates and describes an example of a state after the thinning of a solder resist layer.

Different implementations may use different processes for forming the metal layer(s). In some implementations, a chemical vapor deposition (CVD) process and/or a physical vapor deposition (PVD) process for forming the metal layer(s). For example, a sputtering process, a spray coating process, and/or a plating process may be used to form the metal layer(s).

Figure 12:
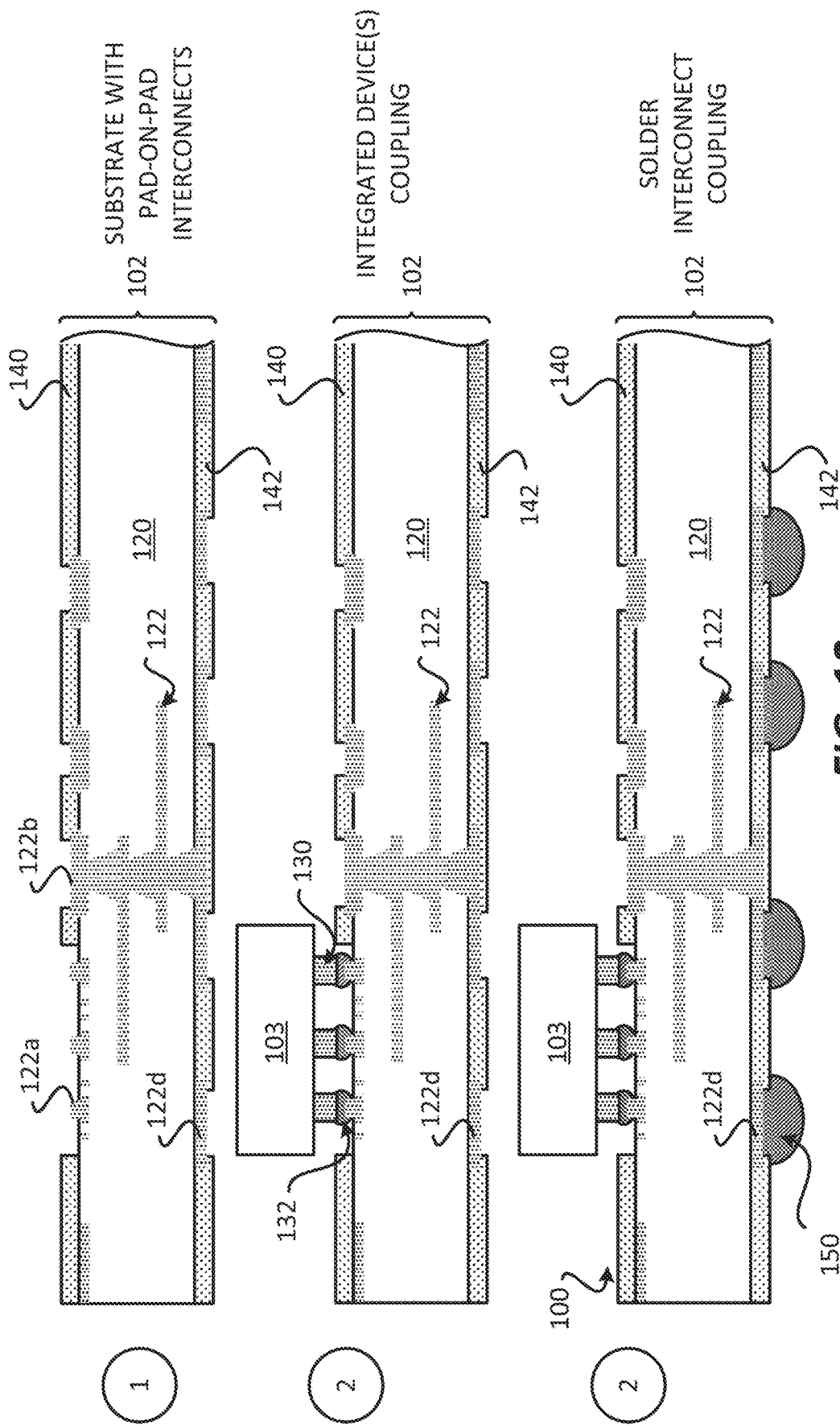
FIG. 12 illustrates an exemplary sequence for fabricating a package that includes a substrate comprising pad-on-pad interconnects.

Exemplary Sequence for Fabricating a Package that Includes a Substrate Comprising Pad-On-Pad Interconnects FIG. 12 illustrates an exemplary sequence for providing or fabricating a package that includes a substrate comprising pad-on-pad interconnects. In some implementations, the sequence of FIG. 12 may be used to provide or fabricate the package 100 that includes a substrate comprising pad-on-pad interconnects of FIG. 1, or any of the packages (e.g., 300, 400, 500, 600, 700, 800, 900) described in the disclosure.

It should be noted that the sequence of FIG. 12 may combine one or more stages in order to simplify and/or clarify the sequence for providing or fabricating the package. In some implementations, the order of the processes may be changed or modified. In some implementations, one or more of processes may be replaced or substituted without departing from the scope of the disclosure. The sequence of FIG. 12 may be used to fabricate one package or several packages at a time (as part of a wafer).

Stage 1, as shown in FIG. 12, illustrates a state after the substrate 102 is provided. The substrate 102 may be provided by a supplier or fabricated. A process similar to the process shown in FIGS. 10A-10D may be used to fabricate the substrate 102. However, different implementations may use different processes to fabricate the substrate 102. Examples of processes that may be used to fabricate the substrate 102 include a semi-additive process (SAP) and a modified semi-additive process (mSAP). The substrate 102 includes at least one dielectric layer 120, and a plurality of interconnects 122. The plurality of interconnects 122 may include pad-on-pad interconnects (e.g., 122a, 122b). The substrate 102 may include an embedded trace substrate (ETS). In some implementations, the at least one dielectric layer 120 may include prepreg layers.

Stage 2 illustrates a state after the integrated device 103 is coupled to a first surface (e.g., top surface) of the substrate 102. The integrated device 103 may be coupled to the substrate 102 through a plurality of pillar interconnects 130 and a plurality of solder interconnects 132. The plurality of pillar interconnects 130 and the plurality of solder interconnects 132 are coupled to the plurality of pad-on-pad interconnects (e.g., 122a). A solder reflow process may be used to couple the integrated device 103 to the plurality of pad-on-pad interconnects through the plurality of pillar interconnects 130 and the plurality of solder interconnects 132.

Stage 3 illustrates a state after a plurality of solder interconnects 150 is coupled to the substrate 102. The plurality of solder interconnects 150 may be couple to interconnects (e.g., 122d) that are located over a second surface of the at least one dielectric layer 120. A solder reflow process may be used to couple the plurality of solder interconnects 150 to the substrate 102. Stage 3 may illustrate the package 100. The packages (e.g., 100) described in the disclosure may be fabricated one at a time or may be fabricated together as part of one or more wafers and then singulated into individual packages.

Figure 13:
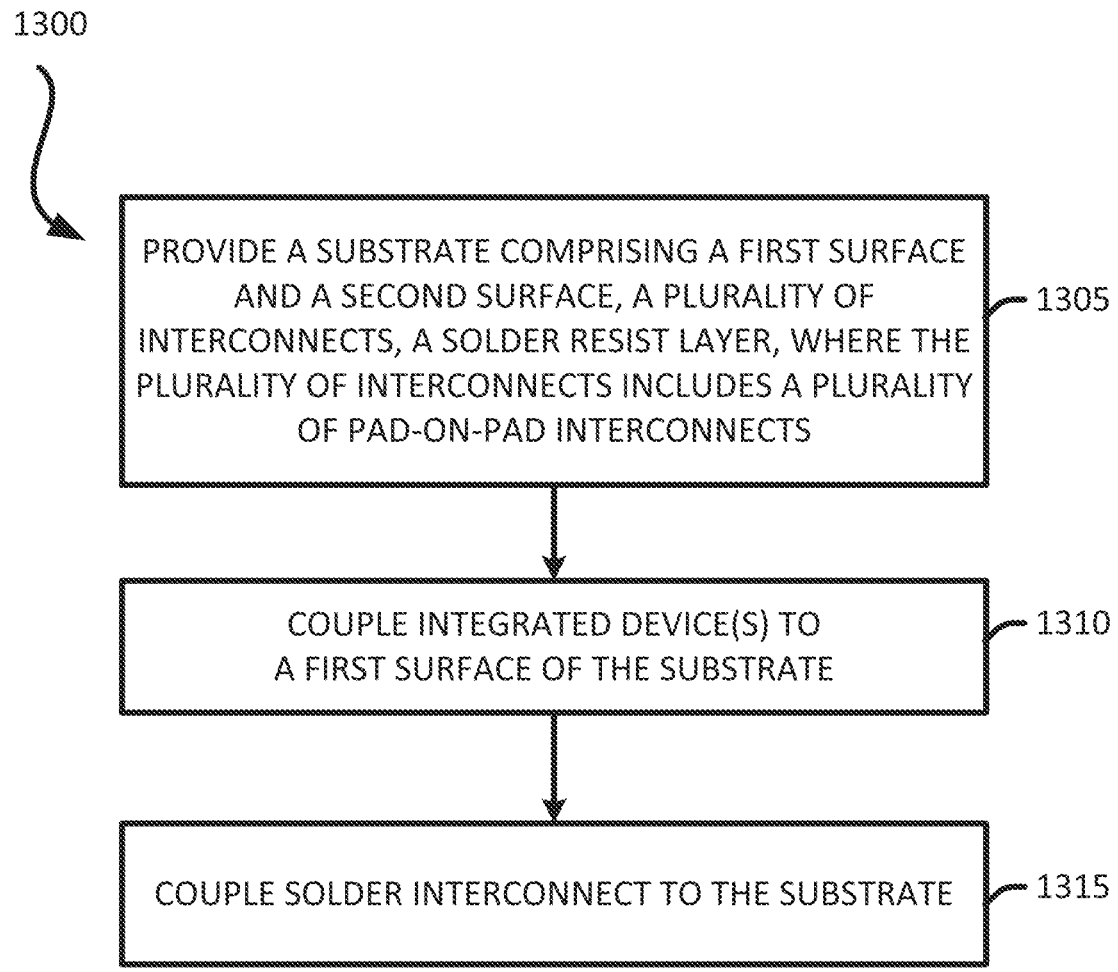
FIG. 13 illustrates an exemplary flow diagram of a method for fabricating a package that includes a substrate comprising pad-on-pad interconnects.

Exemplary Flow Diagram of a Method for Fabricating a Package that Includes a Substrate Comprising Pad-on-Pad Interconnects In some implementations, fabricating a package that includes a substrate comprising pad-on-pad interconnects includes several processes. FIG. 13 illustrates an exemplary flow diagram of a method 1300 for providing or fabricating a package that includes a substrate comprising pad-on-pad interconnects. In some implementations, the method 1300 of FIG. 13 may be used to provide or fabricate the package 100 of FIG. 1 described in the disclosure. However, the method 1300 may be used to provide or fabricate any of the packages (e.g., 300, 400, 500, 600, 700, 800, 900) described in the disclosure.

It should be noted that the method of FIG. 13 may combine one or more processes in order to simplify and/or clarify the method for providing or fabricating a package that includes a substrate comprising pad-on-pad interconnects. In some implementations, the order of the processes may be changed or modified.

The method provides (at 1305) a substrate (e.g., 202) with pad-on-pad interconnects. The substrate 102 may be provided by a supplier or fabricated. The substrate 102 includes at least one dielectric layer 120, and a plurality of interconnects 122. The plurality of interconnects 122 may include pad-on-pad interconnects. The substrate 102 may include an embedded trace substrate (ETS). In some implementations, the at least one dielectric layer 120 may include prepreg layers. Different implementations may provide different substrates. A process similar to the processes shown in FIGS. 10A-10D may be used to fabricate the substrate 102. However, different implementations may use different processes to fabricate the substrate 102. Stage 1 of FIG. 12 illustrates and describes an example of providing a substrate with pad-on-pad interconnects.

The method couples (at 1310) at least one integrated device (e.g., 103) to the first surface of the substrate (e.g., 102). For example, the integrated device 103 may be coupled to the substrate 102 through the plurality of pillar interconnects 130 and the plurality of solder interconnects 132. The plurality of pillar interconnects 130 and the plurality of solder interconnects 132 are coupled to the plurality of pad-on-pad interconnects (e.g., 122a). A solder reflow process may be used to couple the integrated device 103 to the plurality of pad-on-pad interconnects through the plurality of pillar interconnects 130 and the plurality of solder interconnects 132. Stage 2 of FIG. 12 illustrates and describes an example of an integrated device coupled to a substrate.

The method couples (at 1315) a plurality of solder interconnects (e.g., 150) to the second surface of the substrate (e.g., 102). A solder reflow process may be used to couple the plurality of solder interconnects to the substrate. Stage 3 illustrates and describes an example of coupling solder interconnects to the substrate.

Exemplary Electronic Devices

Figure 14:
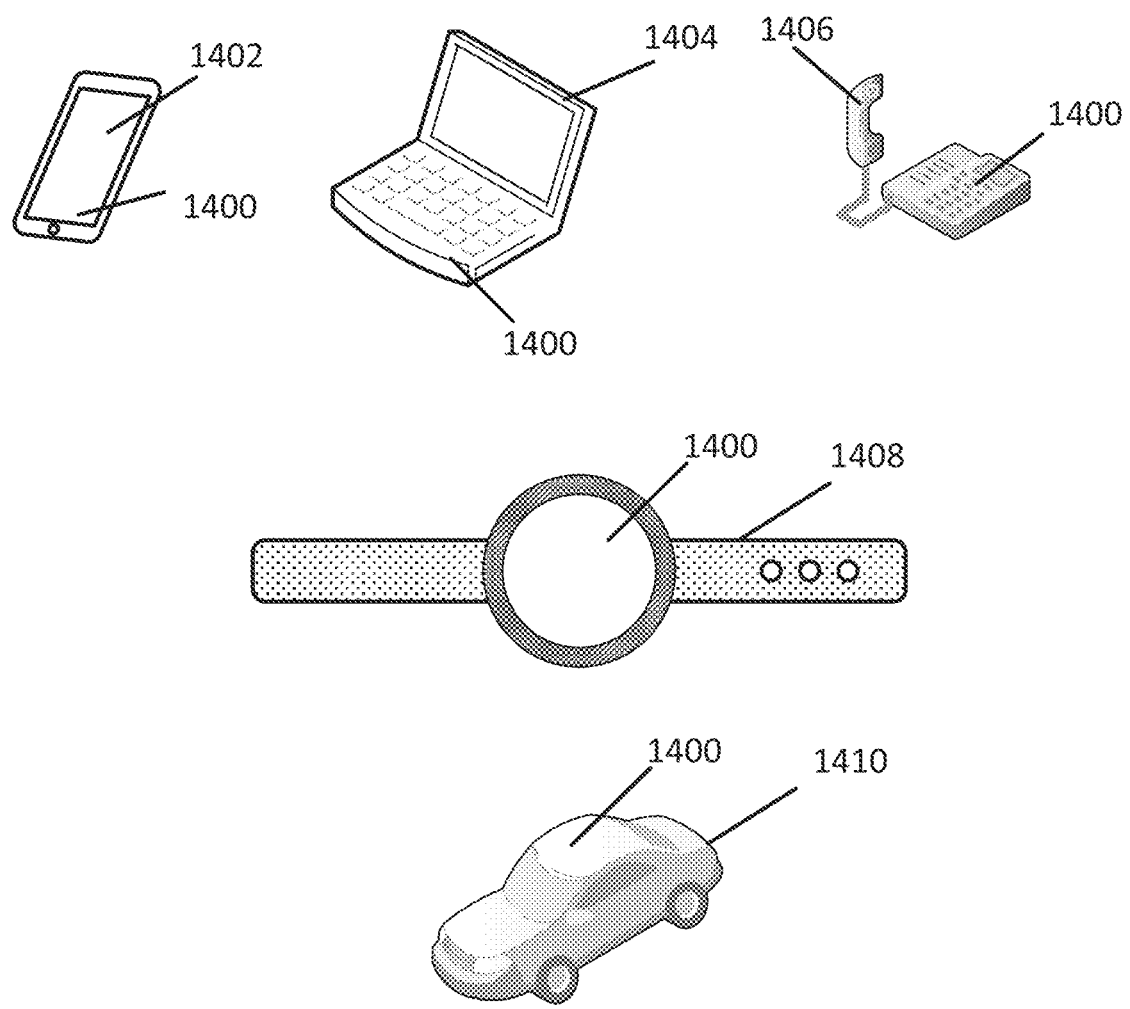
FIG. 14 illustrates various electronic devices that may integrate a die, an electronic circuit, an integrated device, an integrated passive device (IPD), a passive component, a package, and/or a device package described herein.

FIG. 14 illustrates various electronic devices that may be integrated with any of the aforementioned device, integrated device, integrated circuit (IC) package, integrated circuit (IC) device, semiconductor device, integrated circuit, die, interposer, package, package-on-package (PoP), System in Package (SiP), or System on Chip (SoC). For example, a mobile phone device 1402, a laptop computer device 1404, a fixed location terminal device 1406, a wearable device 1408, or automotive vehicle 1410 may include a device 1400 as described herein. The device 1400 may be, for example, any of the devices and/or integrated circuit (IC) packages described herein. The devices 1402, 1404, 1406 and 1408 and the vehicle 1410 illustrated in FIG. 14 are merely exemplary. Other electronic devices may also feature the device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 1-9, 10A-10D, and/or 11-14 may be rearranged and/or combined into a single component, process, feature or function or embodied in several components, processes, or functions. Additional elements, components, processes, and/or functions may also be added without departing from the disclosure. It should also be noted FIGS. 1-9, 10A-10D, and/or 11-14 and its corresponding description in the present disclosure is not limited to dies and/or ICs. In some implementations, FIGS. 1-9, 10A-10D, and/or 11-14 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the invention.

Aspect 1: A package comprising a substrate and an integrated device coupled to the substrate. The substrate includes at least one dielectric layer; and a plurality of interconnects comprising a plurality of pad-on-pad interconnects. The plurality of pad-on-pad interconnects is embedded through a first surface of the substrate.

Aspect 2: The package of aspect 1, wherein the plurality of pad-on-pad interconnects includes a first pad-on-pad interconnect comprising a first pad and a second pad coupled to the first pad.

Aspect 3: The package of aspect 2, wherein the first pad has a first width and the second pad has a second width.

Aspect 4: The package of aspect 3, wherein the first width is different than the second width.

Aspect 5: The package of aspects 2 through 4, wherein the second pad is located in the at least dielectric layer, and wherein the first pad is located over a surface of the at least dielectric layer.

Aspect 6: The package of aspects 2 through 5, wherein the first pad and the second pad are part of the same pad.

Aspect 7: The package of aspects 2 through 6, wherein the second pad has a thickness of 15 micrometers or less.

Aspect 8: The package of aspects 2 through 7, wherein the second pad includes a seed layer.

Aspect 9: The package of aspects 1 through 8, wherein the plurality of interconnects includes a plurality of surface interconnects located over a second surface of the substrate.

Aspect 10: The package of aspects 1 through 9, wherein the integrated device is coupled to the plurality of pad-on-pad interconnects of the substrate.

Aspect 11: The package of aspects 1 through 10, wherein the plurality of pad-on-pad interconnects includes a minimum width of 10 micrometers and a minimum spacing of 10 micrometers.

Aspect 12: The package of aspects 1 through 11, wherein a minimum spacing between a pad-on-pad interconnect and an interconnect is 10 micrometers.

Aspect 13: The package of aspects 1 through 12, further comprising a solder resist layer located over the first surface of the substrate.

Aspect 14: The package of aspect 13, wherein the solder resist layer comprises a first solder resist layer portion comprising a first thickness; and a second solder resist layer portion comprising a second thickness that is less than the first thickness.

Aspect 15: The package of aspect 14, wherein the second solder resist layer portion is located between the at least one dielectric layer and the integrated device.

Aspect 16: An apparatus comprising a substrate that includes at least one dielectric layer; and a plurality of interconnects comprising a plurality of pad-on-pad interconnects, wherein the plurality of pad-on-pad interconnects is embedded through a first surface of the substrate.

Aspect 17: The apparatus of aspect 16, wherein the plurality of pad-on-pad interconnects includes a first pad-on-pad interconnect comprising a first pad and a second pad coupled to the first pad.

Aspect 18: The apparatus of aspect 17, wherein the first pad has a first width and the second pad has a second width.

Aspect 19: The apparatus of aspect 18, wherein the first width is different than the second width.

Aspect 20: The apparatus of aspects 17 through 19, wherein the second pad is located in the at least dielectric layer, and wherein the first pad is located over a surface of the at least dielectric layer.

Aspect 21: The apparatus of aspects 17 through 20, wherein the first pad and the second pad are part of the same pad.

Aspect 22: The apparatus of aspects 16 through 21, wherein the plurality of interconnects includes a plurality of surface interconnects located over a second surface of the substrate.

Aspect 23: The apparatus of aspects 16 through 22, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

Aspect 24: A method for fabricating a package. The method provides a substrate comprising at least one dielectric layer; and a plurality of interconnects comprising a plurality of pad-on-pad interconnects, wherein the plurality of pad-on-pad interconnects is embedded through a first surface of the substrate. The method couples an integrated device to the substrate.

Aspect 25: The method of aspect 24, wherein the plurality of pad-on-pad interconnects includes a first pad-on-pad interconnect comprising a first pad and a second pad coupled to the first pad.

Aspect 26: The method of aspect 25, wherein the first pad has a first width and the second pad has a second width.

Aspect 27: The method of aspect 26, wherein the first width is different than the second width.

Aspect 28: The method of aspects 25 through 27, wherein the second pad is located in the at least dielectric layer, and wherein the first pad is located over a surface of the at least dielectric layer.

Aspect 29: The method of aspects 25 through 28, wherein the first pad and the second pad are part of the same pad.

Aspect 30: The method of aspects 24 through 29, wherein the plurality of interconnects includes a plurality of surface interconnects located over a second surface of the substrate.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A package comprising:
   an integrated device;
   a substrate comprising:
     at least one dielectric layer; and
     a plurality of interconnects comprising a plurality of pad-on-pad interconnects, wherein the plurality of pad-on-pad interconnects are at least partially embedded through a first surface of the substrate;
     a first pad-on-pad interconnect of the plurality of pad-on-pad interconnects;
     a second pad-on-pad interconnect of the plurality of pad-on-pad interconnects;
     a trace embedded through the first surface of the substrate, located underneath the integrated device and between the first pad-on-pad interconnect and the second pad-on-pad interconnect, wherein the integrated device is coupled to the substrate; and
   a solder resist layer located at least partially over the first surface of the substrate including:
     a first solder resist portion having a first thickness, located adjacent the second pad-on-pad interconnect; and
     a second solder resist portion having a second thickness, located over the trace, wherein the second thickness is less than the first thickness.

2. The package of claim 1, wherein the first pad-on-pad interconnect of the plurality of pad-on-pad interconnects comprises a first pad and a second pad coupled to the first pad.

3. The package of claim 2, wherein the first pad has a first width and the second pad has a second width.

4. The package of claim 3, wherein the first width is different than the second width.

5. The package of claim 2,
   wherein the first pad is located in the at least dielectric layer, and
   wherein the second pad is located over a surface of the at least dielectric layer.

6. The package of claim 2, wherein the first pad and the second pad are part of the same pad.

7. The package of claim 2, wherein the second pad has a thickness of 15 micrometers or less.

8. The package of claim 2, wherein the second pad includes a seed layer.

9. The package of claim 1, wherein the plurality of interconnects includes a plurality of surface interconnects located over a second surface of the substrate.

10. The package of claim 1, wherein the integrated device is coupled to the plurality of pad-on-pad interconnects of the substrate.

11. The package of claim 1, wherein the plurality of pad-on-pad interconnects includes a minimum width of 10 micrometers and a minimum spacing of 10 micrometers.

12. The package of claim 1, wherein a minimum spacing between the first pad-on-pad interconnect and the trace is 10 micrometers.

13. The package of claim 1, wherein the second solder resist portion is located between the at least one dielectric layer and the integrated device.

14. The package of claim 1:
   wherein the first pad-on-pad interconnect is located underneath the integrated device and the second pad-on-pad interconnect is located in an area not under the integrated device; and
   wherein the first solder resist portion is located in another area not under the integrated device.

15. An apparatus comprising:
a substrate comprising:
- at least one dielectric layer;
- a plurality of interconnects comprising a plurality of pad-on-pad interconnects, wherein the plurality of pad-on-pad interconnects are at least partially embedded through a first surface of the substrate;
- a first pad-on-pad interconnect of the plurality of pad-on-pad interconnects;
- a second pad-on-pad interconnect of the plurality of pad-on-pad interconnects;
- a trace embedded through the first surface of the substrate, configured to be located underneath an integrated device; and between the first pad-on-pad interconnect and the second pad-on-pad interconnect, wherein the substrate is configured to be coupled to the integrated device; and a solder resist layer located at least partially over the first surface of the substrate including:
- a first solder resist portion having a first thickness, located adjacent the second pad-on-pad interconnect; and
- a second solder resist portion having a second thickness, located over the trace, wherein the second thickness is less than the first thickness.

16. The apparatus of claim 15, wherein the first pad-on-pad interconnect of the plurality of pad-on-pad interconnects comprises a first pad and a second pad coupled to the first pad.

17. The apparatus of claim 16, wherein the first pad has a first width and the second pad has a second width.

18. The apparatus of claim 17, wherein the first width is different than the second width.

19. The apparatus of claim 16,
wherein the first pad is located in the at least dielectric layer, and
wherein the second pad is located over a surface of the at least dielectric layer.

20. The apparatus of claim 16, wherein the first pad and the second pad are part of the same pad.

21. The apparatus of claim 15, wherein the plurality of interconnects includes a plurality of surface interconnects located over a second surface of the substrate.

22. The apparatus of claim 15, wherein the apparatus includes a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, and a device in an automotive vehicle.

23. A method for fabricating a package, comprising:
providing an integrated device;
providing a substrate comprising:
- at least one dielectric layer; and
- a plurality of interconnects comprising a plurality of pad-on-pad interconnects, wherein the plurality of pad-on-pad interconnects are at least partially embedded through a first surface of the substrate;
- a first pad-on-pad interconnect of the plurality of pad-on-pad interconnects;
- a second pad-on-pad interconnect of the plurality of pad-on-pad interconnects;
- a trace embedded through the first surface of the substrate, located underneath the integrated device and between the first pad-on-pad interconnect and the second pad-on-pad interconnect, wherein the integrated device is coupled to the substrate; and providing a solder resist layer located at least partially over the first surface of the substrate including:
- a first solder resist portion having a first thickness, located adjacent the second pad-on-pad interconnect; and
- a second solder resist portion having a second thickness, located over the trace, wherein the second thickness is less than the first thickness.

24. The method of claim 23, wherein the first pad-on-pad interconnect of the plurality of pad-on-pad interconnects comprises a first pad and a second pad coupled to the first pad.

25. The method of claim 24, wherein the first pad has a first width and the second pad has a second width.

26. The method of claim 25, wherein the first width is different than the second width.

27. The method of claim 24,
wherein the first pad is located in the at least dielectric layer, and
wherein the second pad is located over a surface of the at least dielectric layer.

28. The method of claim 24, wherein the first pad and the second pad are part of the same pad.

29. The method of claim 23, wherein the plurality of interconnects includes a plurality of surface interconnects located over a second surface of the substrate.

30. The method of claim 23:
wherein the first pad-on-pad interconnect is located underneath the integrated device and the second pad-on-pad interconnect is located in an area not under the integrated device; and
wherein the first solder resist portion is located in another area not under the integrated device.

* * * * *